US012363956B2

(12) United States Patent
Fulford et al.

(10) Patent No.: US 12,363,956 B2
(45) Date of Patent: Jul. 15, 2025

(54) 2D MATERIAL TO INTEGRATE 3D HORIZONTAL NANOSHEETS USING A CARRIER NANOSHEET

(71) Applicant: Tokyo Electron Limited, Tokyo (JP)

(72) Inventors: H. Jim Fulford, Albany, NY (US); Mark I. Gardner, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 611 days.

(21) Appl. No.: 17/578,412

(22) Filed: Jan. 18, 2022

(65) Prior Publication Data

US 2023/0108707 A1   Apr. 6, 2023

Related U.S. Application Data

(60) Provisional application No. 63/252,522, filed on Oct. 5, 2021.

(51) Int. Cl.
| | |
|---|---|
| *H10D 30/67* | (2025.01) |
| *H10D 30/01* | (2025.01) |
| *H10D 30/47* | (2025.01) |
| *H10D 62/10* | (2025.01) |
| *H10D 64/23* | (2025.01) |
| *H10D 84/83* | (2025.01) |
| *H10D 88/00* | (2025.01) |
| *B82Y 10/00* | (2011.01) |
| *H10D 62/80* | (2025.01) |

(52) U.S. Cl.
CPC ....... *H10D 30/6757* (2025.01); *H10D 30/017* (2025.01); *H10D 30/481* (2025.01); *H10D 30/6735* (2025.01); *H10D 62/121* (2025.01); *H10D 64/251* (2025.01); *H10D 84/832* (2025.01); *B82Y 10/00* (2013.01); *H10D 62/80* (2025.01); *H10D 88/00* (2025.01)

(58) Field of Classification Search
CPC ............... H01L 27/0688; H01L 27/092; H01L 29/0665; H01L 29/41725; H01L 29/42392; H01L 29/513; H01L 29/66742; H01L 29/78696; B82Y 10/00; H10D 30/017; H10D 30/481; H10D 30/6735; H10D 30/6757; H10D 62/121; H10D 84/832
See application file for complete search history.

(56) References Cited

U.S. PATENT DOCUMENTS

| | | | |
|---|---|---|---|
| 9,024,376 B2 | 5/2015 | Masuoka et al. | |
| 9,425,324 B2 | 8/2016 | Diaz et al. | |

(Continued)

*Primary Examiner* — Yara B Green
*Assistant Examiner* — Christopher M Roland
(74) *Attorney, Agent, or Firm* — Foley & Lardner LLP

(57) ABSTRACT

One or more 3D transistor structures that use one or more 2D materials as transistor channels along with methods for fabricating the same are disclosed. A 3D transistor can include a first carrier nanosheet at least partially surrounded by a first 2D material and a second carrier nanosheet at least partially surrounded by a second 2D material. The transistor can include a first source/drain structure in electrical contact with a first end of the first 2D material and a first end of the second 2D material. The transistor can include a second source/drain structure in electrical contact with a second end of the first 2D material and a second end of the second 2D material. The transistor can include a gate structure at least partially surrounding the first 2D material and the second 2D material.

20 Claims, 36 Drawing Sheets

(56) References Cited

U.S. PATENT DOCUMENTS

| | | |
|---|---|---|
| 9,478,624 B2 | 10/2016 | Colinge et al. |
| 2021/0135015 A1* | 5/2021 | Frougier ........... H01L 29/66787 |
| 2021/0305372 A1* | 9/2021 | Khaderbad ....... H01L 29/66795 |
| 2021/0391478 A1* | 12/2021 | Maxey ................. H01L 29/778 |
| 2022/0077321 A1* | 3/2022 | Seol ..................... H01L 29/778 |
| 2023/0114024 A1* | 4/2023 | Gardner ............... H01L 27/092 |
| | | 257/401 |

\* cited by examiner

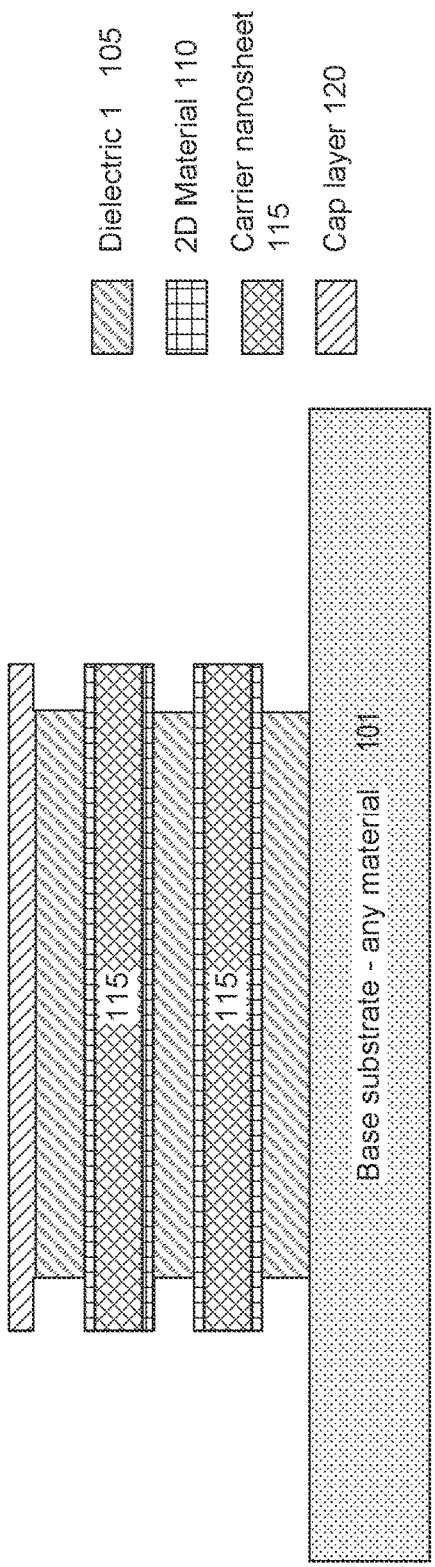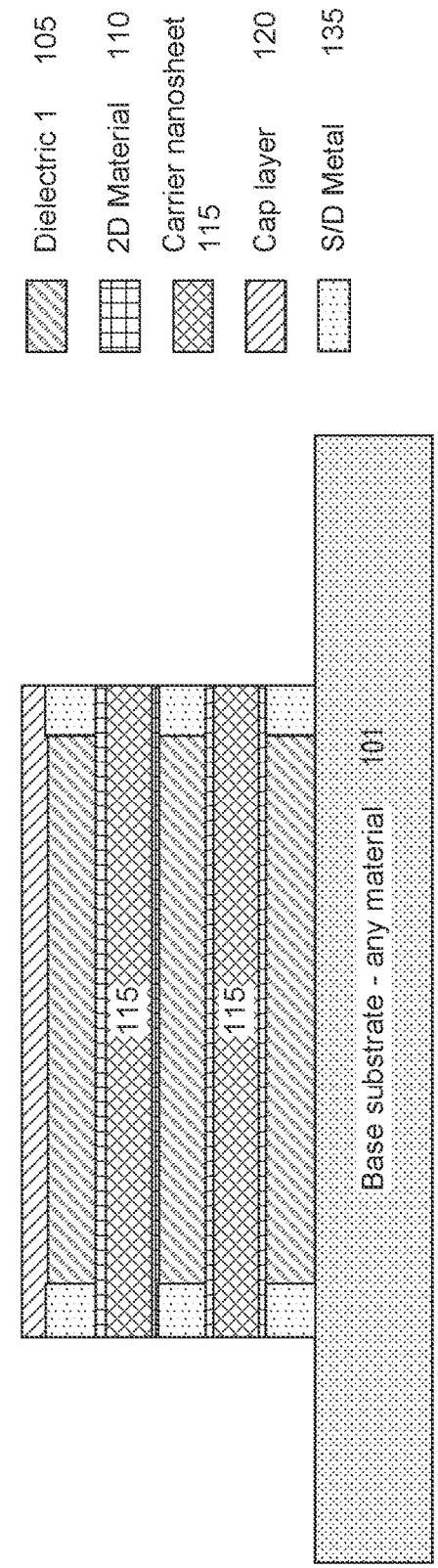
FIG. 12
FIG. 13

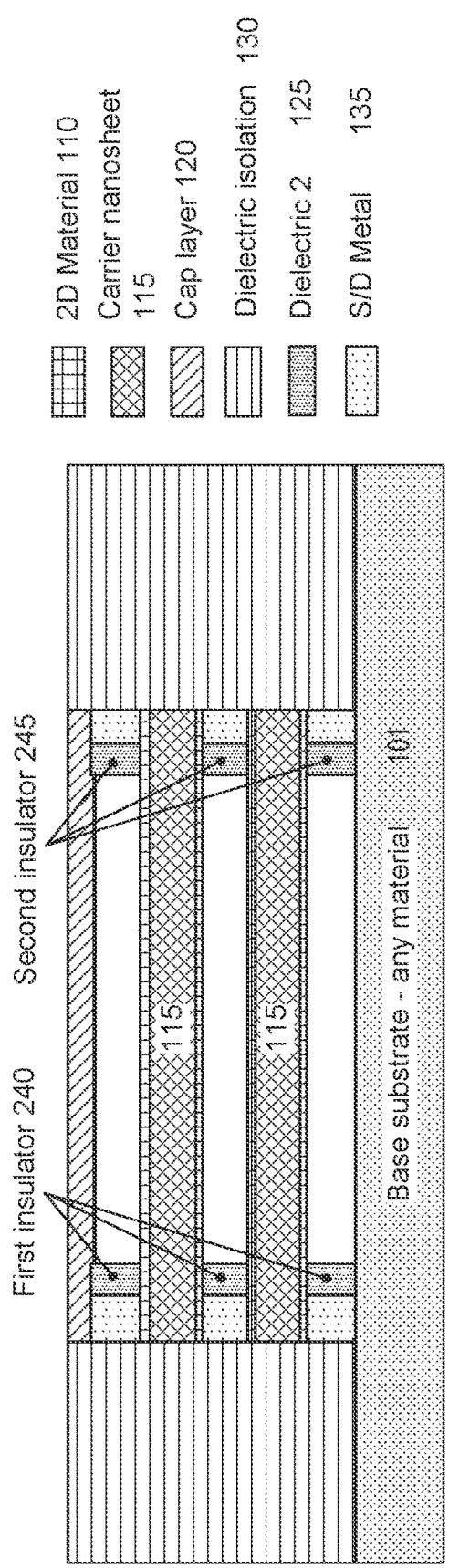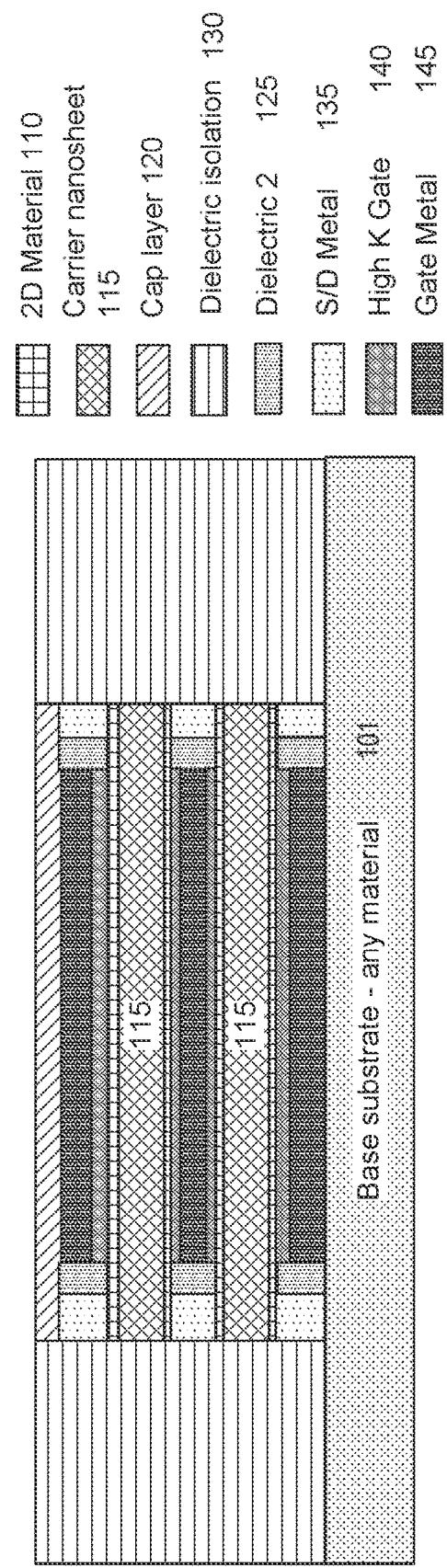
FIG. 16
FIG. 17

2D MATERIAL TO INTEGRATE 3D HORIZONTAL NANOSHEETS USING A CARRIER NANOSHEET

CROSS-REFERENCE TO RELATED APPLICATIONS

This application claims priority to U.S. Provisional Patent Application Ser. No. 63/252,522, filed Oct. 5, 2021, which is incorporated by reference in its entirety.

TECHNICAL FIELD

The present invention relates generally to the field of manufacturing semiconductor devices.

BACKGROUND

Modern semiconductor integrated circuit device fabrication normally relies on well-established processes, such as film-forming depositions, etch mask creation, patterning, material etching and removal, and doping treatments, many of which are performed repeatedly to form desired circuits on a substrate. At the same time, the semiconductor industry is facing pressure to continue scaling down and improving the performance of the semiconductor integrated circuits, such as by reducing their power consumption and increasing their rates of operation. Conventional fabrication techniques manufacture integrated circuits usually in one plane, while wiring or metallization can typically be formed above the active device plane. Devices manufactured using these techniques are typically characterized as two-dimensional (2D) circuits. Although scaling efforts in 2D circuit fabrication have increased the number of transistors per unit area, 2D fabrication techniques remain limited as they are approaching physical atomic limitations in which transistor features are on the order of single nanometers. Semiconductor device fabricators have expressed a desire for new solutions.

SUMMARY

As semiconductor device fabricators work with traditional silicon wafer fabrication techniques to continue scaling down silicon-based transistor channels, leakage currents become exacerbated as some transistor features can have features with different voltage potentials separated by materials that are only single-digit atom sizes thick. In such an environment, the short-channel effect can become increasingly difficult to control, making down-scaling of transistor gates for large scale integrated circuits no longer practicable or even possible.

The solution provided herein addresses the short-channel effect and other similar problems by providing a transistor architecture that utilizes 2D material layers structurally supported by semiconductor nanosheets to form effective transistor channels that allow for continued performance improvement and scaling down of transistors. In addition, the techniques, features, processes and structures provided by the present solution can be implemented using known and conventional fabrication steps and tools, which allow for a smooth and cost-effective implementation of the present solution in the existing fabrication facilities.

Described herein is one or more transistor structures along with methods and techniques of fabricating of one or more 3D transistors utilizing one or more 2D material channels formed using carrier nanosheets. One such example structure can include two carrier nanosheets, although a single carrier nanosheet implementation can be used, as well. The carrier nanosheets can be entirely or at least partially coated or surrounded a thin layer of 2D material, which can include a single-layer material that can be used to form the channel regions of the transistor. On either side of the channel region, such as for example at the ends of the two nanosheets, source and drain structures formed using metal, or other electrically conductive materials, can be provided. A gate structure including a high-k gate material and a gate metal contact can be formed on at least one or more sides of the channel region, abutting the 2D material on the carrier nanosheets. The gate structure can also be provided on multiple sides of the channel regions and in some implementations can completely surround the central portion of the channel regions between the source and the drain connections. For example, the gate structure can envelop or surround the central portion of each 2D material surrounded carrier nanosheet at the central region of the carrier nanosheets spanned between the source structure and the drain structure at two distal ends of the transistor, thus forming a gate all around (GAA) structure. A dielectric may be provided at distal ends of channel regions (e.g., at or near the ends of carrier nanosheets) to electrically isolate the source/drain structures (e.g., source/drain metal) from the conductive portion of the gate structure (e.g., the gate metal). Additional dielectric isolation and electrical routing can be provided around the transistor structure to isolate the transistor from adjacent structures and provide for electrical connect of the source, gate and drain structures with respective inputs and outputs, and thereafter with a circuit of the device of which the transistor can be a part.

In some aspects the present disclosure relates to transistor. The transistor can include a first carrier nanosheet at least partially surrounded by a first 2D material and a second carrier nanosheet at least partially surrounded by a second 2D material. The transistor can include a first source/drain structure in electrical contact with a first end of the first 2D material and a first end of the second 2D material. The transistor can include a second source/drain structure in electrical contact with a second end of the first 2D material and a second end of the second 2D material. The transistor can include a gate structure at least partially surrounding the first 2D material and the second 2D material.

The transistor can further include a high-k gate material formed between the gate structure and the first 2D material and between the gate structure and the second 2D material. The transistor can also include a first dielectric material electrically insulating the gate structure from the first source/drain structure and a second dielectric material electrically insulating the gate structure from the second source/drain structure.

The transistor can include the first 2D material disposed between a top surface of the first carrier nanosheet and a first high-k gate material and between a bottom surface of the first carrier nanosheet and the first high-k gate material. The transistor can also include the second 2D material disposed between a top surface of the second carrier nanosheet and a second high-k gate material and between a bottom surface of the second carrier nanosheet and the second high-k gate material.

The transistor can further include the gate structure disposed between the first high-k gate material and the second high-k gate material. The transistor can include the gate structure at least partially surrounding the first 2D material being common with the gate structure at least partially surrounding the second 2D material.

The transistor can include the first 2D material that is different from the second 2D material. The transistor can also include the first source/drain structure that comprises a first electrically conductive material and the second source/drain structure that comprises a second electrically conductive material that is different than the first electrically conductive material. The transistor can further include the first and second carrier nanosheets that are parallel with one another, the second carrier nanosheet above the first carrier nanosheet and parallel with a substrate.

In some aspects, the present disclosure relates to a method. The method can be for fabricating the transistor structure that includes one or more 2D material channels. A first carrier nanosheet that is at least partially surrounded by a first 2D material can be formed. A second carrier nanosheet that is at least partially surrounded by a second 2D material can be formed. A first source/drain structure in electrical contact with a first end of the first 2D material and a first end of the second 2D material can be formed. A second source/drain structure in electrical contact with a second end of the first 2D material and a second end of the second 2D material can be formed. A gate structure at least partially surrounding the first 2D material and the second 2D material can be formed.

In some aspects, the method can include forming a high-k gate material between the gate structure and the first 2D material and between the gate structure and the second 2D material. A first dielectric material electrically insulating the gate structure from the first source/drain structure and a second dielectric material electrically insulating the gate structure from the second source/drain structure can be formed.

The first 2D material disposed between a top surface of the first carrier nanosheet and a first high-k gate material and between a bottom surface of the first carrier nanosheet and the first high-k gate material can be formed. The second 2D material can be disposed between a top surface of the second carrier nanosheet and a second high-k gate material and between a bottom surface of the second carrier nanosheet and the second high-k gate material.

The gate structure disposed between the first high-k gate material and the second high-k gate material can be formed. The gate structure at least partially surrounding the first 2D material common with the gate structure at least partially surrounding the second 2D material can also be formed.

The first 2D material can be different from the second 2D material. The first source/drain structure comprising a first electrically conductive material can be formed along with the second source/drain structure that can comprise a second electrically conductive material that is different than the first electrically conductive material. The first and second carrier nanosheets can be formed to be parallel with one another, the second carrier nanosheet above the first carrier nanosheet and parallel with a substrate.

In some aspects, the present disclosure relates to a device. The device can include a source contact having a sidewall surface, a drain contact having a sidewall surface and a channel layer extending between the sidewall surfaces of the source and drain contacts, the channel layer comprising a 2D material. The device can also include a gate structure isolated from the source and drain contacts and provided on at least one side of the 2D material, the gate structure comprising a gate contact and a gate dielectric between the gate contact and the 2D material. The device can also include the channel layer supported by a carrier nanosheet, the 2D material formed between a surface of the carrier nanosheet and the gate dielectric.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings:

FIGS. 10-19 illustrate cross-sectional views of another example structure of a 3D transistor utilizing 2D material channels and a set of fabrication steps for creating the same, according to one or more embodiments;

DETAILED DESCRIPTION

Figure 1:
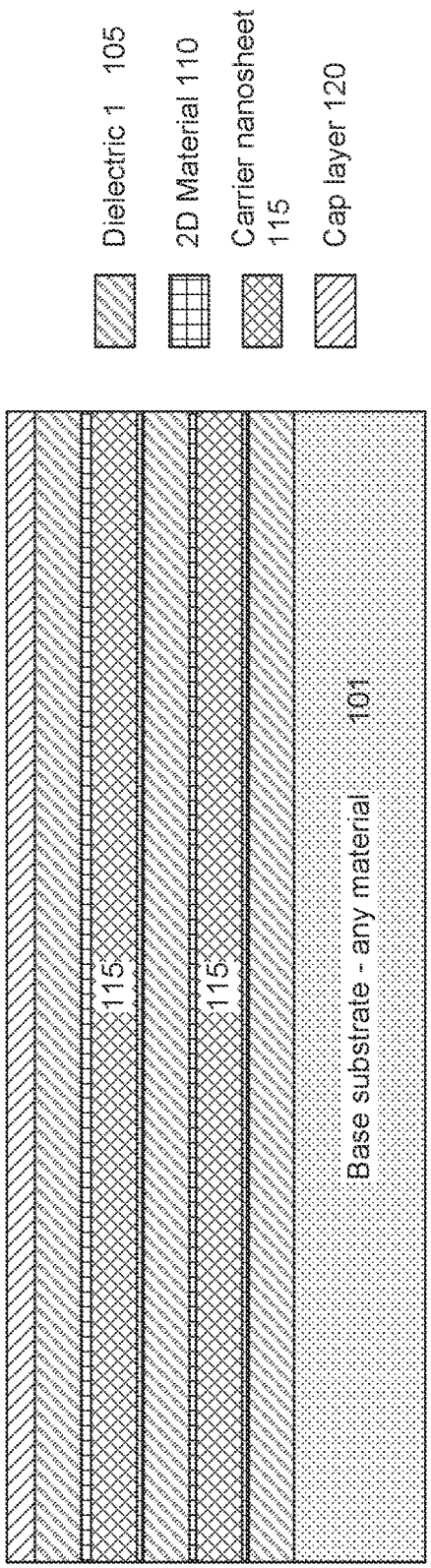
FIGS. 1-9 illustrate cross-sectional views of an example structure of a 3D transistor utilizing 2D material channels as well as a set of fabrication steps for creating the same, according to one or more embodiments.

References will now be made to various illustrative embodiments depicted in the drawings, and specific language will be used to describe the same. It will nevertheless be understood that no limitation of the scope of the claims or this disclosure is thereby intended. Alterations and further modifications of the inventive features illustrated herein, and additional applications of the principles of the subject matter illustrated herein, which would be apparent to one of ordinary skill in the relevant art having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

It is understood that apparatuses, systems and devices produced by the structures described herein can be used or find their application in any number of electronic devices utilizing structures and/or circuits described herein, such as for example, controllers, memory chips, systems or process on a chip processors, graphics processing units, central processing units and more. For example, structures and/or circuits described herein can include a part of systems utilizing memory, such as any computing systems including for example: computers, phones, servers, cloud computing devices, and any other device or system that utilizes integrated circuit devices.

The embodiments described herein may enable an increased stack height of one or more 3D semiconductor devices. Therefore, a semiconductor substrate can be used, but is not required, and any base layer material (e.g., glass, plastic, etc.) may be used instead of a traditional silicon substrate. A base layer, therefore, can be a semiconductor substrate, such as a silicon substrate. Some embodiments include 3D stacks of vertical conductive channel nanosheets in both CFET and side-by-side configurations.

The process flows described herein utilize conductive dielectric materials to form NMOS and PMOS devices. As such, the techniques described herein can be used to produce devices that are manufactured, or "stacked" on any existing vertically stacked device or substrate, such as metal, plastic, or otherwise, according to various implementations. The present techniques may improve upon other semiconductor manufacturing techniques by increasing the Nheight of stacked semiconductor devices, such as transistors, thereby providing high density logic. Although illustrations herein may show an NMOS device arranged over a PMOS device, alternative configurations may include a PMOS device over NMOS device, NMOS device over NMOS device, PMOS device over PMOS device, or other alternative including one or more NMOS devices or PMOS devices for any number of N stacks.

Dielectric materials used herein can be any material or materials having low electrical conductivity, such as for example one millionth of a mho/cm. Dielectric materials can include, for example, silicon dioxide, silicon nitride, nanoporous silica, hydrogensilsesquioxanes (HSQ), Teflon-AF (Polytetrafuoethene or PTFE), Silicon Oxyflouride. Dielectric materials can also include, for example, ceramics, glass, mica, plastics and oxides of various metals.

High-K dielectric, also referred to as high-k material, can refer to any material with a higher dielectric constant as compared to the silicon dioxide. For example, high-k dielectric can include hafnium silicate, zirconium silicate, hafnium dioxide, zirconium dioxide, and others.

Various metals, such as gate metal and the source/drain metal, can be used herein and can include any metal or any electrically conductive material. For example metals used in the present solution can include aluminum, copper, titanium, tungsten, silver, gold or any other metal. For the purposes of the present solution, in addition to the metals, source/drain metals or gate metals can also include other electrically conductive materials, such as highly doped semiconductors, for example.

The present solution can also utilize 2D materials for forming transistor channels. 2D materials can include, for example, but are not limited to, WS2, WSe2, WTe2, MoS2, MoSe2, MoTe2, HfS2, ZrS2, and TiS2, GaSe, InSe, phosphorene, and other similar materials. These materials can be deposited by an atomic layer deposition (ALD) process and may be about 5-15 angstroms thick, the thinness lending to their name—2D material. 2D material 110 layer can, depending on the material and design, and can have a broader range of thicknesses, such as between 0.2 nm and 3.0 nm, for example. 2D materials can be annealed during or after the device formation process to recrystallize or grow the crystals and thereby improve electrical characteristics. 2D material, for example, can be electrically conductive.

Additionally or alternatively, 2D materials to be used for forming 2D channels may comprise one or more semiconductive-behaving materials, which may be formed using certain elements that, when combined with oxygen, form a new material that exhibits semiconductive behavior. For example, the semiconductive behaving material can be "turned OFF" and can have a low or practically no off-state leakage current and can be "turned ON" and become highly conductive when voltage is applied. Example materials to create an n-type channel for example include, but are not limited to, In2O3, SnO2, In GaZnO, and ZnO. Example materials that can be used to create a p-type channel may be formed utilizing, for example, SnO. These materials may be further doped to improve the electrical characteristics. These materials may be referred to as conductive oxides or semiconductive behaving oxides for the purposes of this disclosure.

Reference will now be made to the figures, which for the convenience of visualizing the 3D semiconductor fabrication techniques described herein, illustrate a substrate undergoing a process flow in both top and cross-sectional views. Unless expressly indicated otherwise, each Figure represents one (or a set) of fabrication steps in a process flow for manufacturing the devices described herein. In the top and cross-sectional views of the Figures, connections between conductive layers or materials may be shown. However, it should be understood that these connections between various layers and masks are merely illustrative, and are intended to show a capability for providing such connections, nor should they be considered limiting to the scope of the claims.

Likewise, although the Figures and aspects of the disclosure may show or describe devices herein as having a particular shape, it should be understood that such shapes are used as examples of the present solution and are merely illustrative and should not be considered limiting to the scope of the techniques described herein. For example, although most of the Figures show various layers in a rectangular shaped configuration, other shapes are also contemplated, and indeed the techniques described herein may be implemented in any shape or geometry. In addition, examples in which two transistors or devices are shown stacked on top of one another are shown for illustrative purposes only, and for the purposes of simplicity. Indeed, the techniques described herein may provide for one to any number N stacked devices. Likewise, the techniques described herein may provide for one to any number N nanosheets and 2D material layer channels stacked in a transistor. Further, although the devices fabricated using these techniques are shown as transistors, it should be understood that any type of electric electronic device may be manufactured using such techniques, including but not limited to transistors, variable resistors, resistors, and capacitors.

Despite the fact that illustrated embodiments for simplicity and brevity show examples of only a single or two transistors being formed using the techniques of the present solution, any number of transistors can be formed above and beside the transistor structures illustrated in examples illustrated, such as may be desired for forming a 3D array of devices. Likewise, even though illustrated examples show a transistor having usually two nanosheets and four 2D material channels formed thereon, it is understood that the transistors can be fabricated using any number of nanosheets and any number of 2D material channels.

Figure 9:
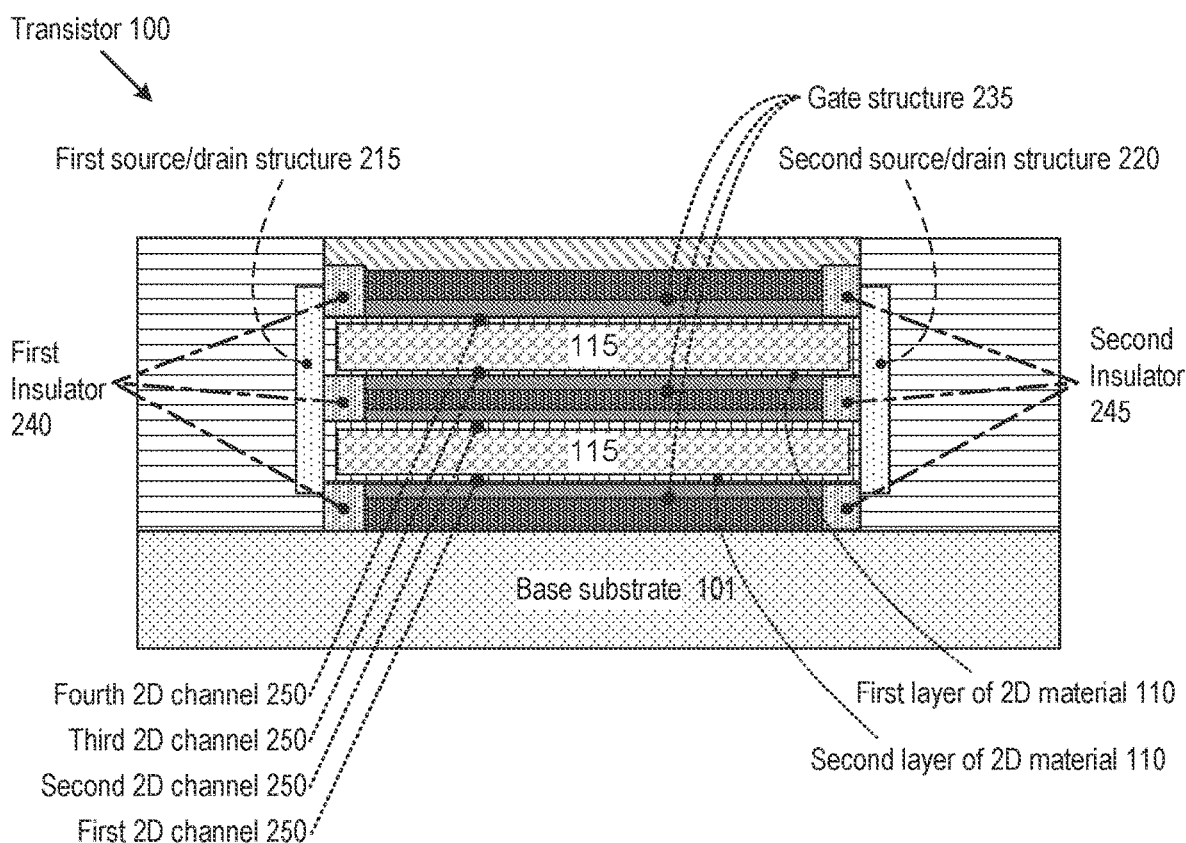

Prior to describing examples of step-by-step fabrication of a 3D transistor utilizing 2D material channels, it may be beneficial to first present and describe an example structure of one such transistor. FIG. 9 depicts an example 3D transistor 100 that can be formed on top of a base substrate 101. Transistor 100 can include a first carrier nanosheet 115 that is at least partially (or entirely) coated, surrounded, or otherwise enveloped by a first layer of 2D material 110 and a second carrier nanosheet 115 that is also at least partially (or entirely) coated, surrounded or otherwise enveloped by a second layer of 2D material 110. The first nanosheet 115 can be formed above the substrate 101 and oriented horizontally and in parallel with respect to the substrate 101. The second nanosheet 115 can be formed above the first nanosheet and oriented horizontally and in parallel with respect to both the substrate 101 and the first nanosheet. At or near the first distal end of each of the first and the second nanosheets 115 can be a first source/drain (hereinafter "S/D") structure 215, which can comprise S/D metal 135 that can correspond to either a source contact or a drain contact of the transistor 100. At or near the second distal end of each of the first and the second nanosheets 115 is a second S/D structure 220, which can also comprise S/D metal 135, and which can correspond to the remaining one of the source contact or the drain contact of the transistor 100. S/D structures 215 and 220 can extend vertically from the substrate and can include one or more sidewalls. The one or more 2D material 110 layers carried by carrier nanosheets 115 and spanned between the S/D structures 215 and 220 can form 2D channels 250 of the transistor 100, although in some implementations 2D channels 250 can be formed without carrier nanosheets 115. Surrounding or enveloping the 2D channels 250 spanned between the two S/D structures 215 and 220 can be a gate structure 235. The gate structure 235 can comprise a high-k gate 140 material and gate metal 145. Gate structure 235 can include a gate all-around (GAA) structure that can be formed around the 2D channels 250. In the GAA structure implementation, the high-k gate 140 can be in physical contact with and surround the first layer of 2D material 110, which can surround the first carrier nanosheet 115 and also be in physical contact with and surround the second layer of 2D material 110, which can surround the second carrier nanosheet 115. Surrounding the high-k gate 140 material can be the gate metal 145, thus completing the GAA structure. At or near the first distal ends of the first and the second carrier nanosheets 115 can be a first insulator 240 electrically insulating the first S/D structure 215 from the gate structure 235 while at or near the second distal end of the first and the second nanosheets 115 can be a second insulator 245 electrically insulating the gate structure 235 from the second S/D structure 220.

While the example transistor 100 illustrated in FIG. 9 includes four transistor 2D channels 250 (also sometimes referred to as the 2D material channels 250) formed by the 2D material 110, any number of 2D channels 250 can be implemented, depending on the design. In the illustrated example, a first layer of 2D material 110 surrounds or envelops the first carrier nanosheet 115 on multiple sides, including the bottom, the top and its two distal ends that interface with S/D structures 215 and 220. Similarly, a second layer of 2D material 110 surrounds or envelops the second carrier nanosheet also on multiple sides, including the bottom, the top and two distal ends that interface with S/D structures 215 and 220. The first transistor channel 250 can be formed by the layer of the 2D material 110 at the bottom surface of the first carrier nanosheet 115. The second transistor channel 250 can be formed by the layer of the first 2D material 110 at the top surface of the first carrier nanosheet 115. The third transistor channel 250 can be formed by the layer of the second 2D material 110 at the bottom surface of the second carrier nanosheet 115. The fourth transistor channel 250 can be formed by the second 2D material 110 at the top surface of the second carrier nanosheet 115. In the illustrated example, because of four 2D channels 250, the drive strength of the transistor 100 can be quadrupled, thus improving the transistor's performance.

In some embodiments, 2D material channels 250 can also be formed by the 2D material 110 layer on the side surfaces of the carrier nanosheet 115. For example, a carrier nanosheet 115 can be shaped as a cuboid with outer surfaces on which 2D channels 250 are supported. The surface areas of the surfaces of the carrier nanosheet 115 can be defined by the sizes of its length, width and thickness any combination of which can provide surface area for 2D channels 250. For example, carrier nanosheet 115 can include a thickness whose size in relation to the size of the length of the carrier nanosheet 115 can be up to $\frac{1}{16}$, $\frac{1}{8}$, $\frac{1}{4}$, $\frac{1}{3}$, $\frac{1}{2}$, 1 or 1.5, 2, 4, 8 or 16 times the length of the carrier nanosheet 115. Similarly, the width of the carrier nanosheet 115 can have a size that in relation to the size of the length of the carrier nanosheet can be up to $\frac{1}{16}$, $\frac{1}{8}$, $\frac{1}{4}$, $\frac{1}{3}$, $\frac{1}{2}$, 1 or 1.5, 2, 4, 8 or 16 times the length of the carrier nanosheet 115. Likewise, the width of the carrier nanosheet 115 can have a size that in relation to the size of the width of the carrier nanosheet can be up to $\frac{1}{16}$, $\frac{1}{8}$, $\frac{1}{4}$, $\frac{1}{3}$, $\frac{1}{2}$, 1 or 1.5, 2, 4, 8 or 16 times the length of the carrier nanosheet 115. Therefore, the carrier nanosheet 115 can include 2D channels 250 on any of its surfaces, including its bottom and top surfaces (e.g., whose areas are defined by the length and width of the nanosheet 115), its side surfaces (e.g., whose areas are defined by the length and thickness of the carrier nanosheet 115) and its end surfaces (e.g., whose areas are defined by the thickness and width of the carrier nanosheet 115). Therefore, 2D channels 250 can be formed on the side surfaces of the carrier nanosheet 115, in addition to those formed along the bottom and top surfaces of the carrier nanosheet 115. In such a design a single carrier nanosheet 115 can support, for example, four 2D material channels 250 spanned between S/D structures 215 and 220 (e.g., along the bottom and top surface and along the two side surfaces of the carrier nanosheet 115), and also include 2D material 110 at its end surfaces for improved electrical contact with the S/D structures 215 and 220. Likewise, a transistor 100 design in which two such carrier nanosheets 115 are used can provide, for example, up to eight 2D material channels 250 spanned between S/D structures 215 and 220.

Referring now to FIGS. 1-9, an example of a 3D transistor 100 structure having four 2D material channels 250 formed on top and bottom surfaces of two carrier nanosheets 115 is described along with a number of fabrication steps used to form it. It is understood that while the example in FIGS. 1-9 shows transistor 100 having four 2D channels 250 formed with two carrier nanosheets 115, the same or similar structure, process or techniques can be used to fabricate a transistor 100 that has three 2D channel 250 formed using the same two carrier nanosheets 115, or a transistor 100 having two 2D channels 250 formed using a single carrier nanosheet 115, or a transistor 100 having a single 2D channel 250 formed using a single carrier nanosheet 115. Likewise, the same or similar structure, process or techniques can be used to create a 3D transistor 100 with any number N of 2D material channels 250 with any number of N carrier nanosheets.

As shown for example in FIG. 1, a stack of material layers can be created on top of a substrate 101. The layer stack can include a first layer of dielectric 1 material (in the legend shown as 105), on top of which can be a first layer of 2D channel material (also referred to as "2D material"), which is shown in the legend as 110. The first layer of 2D channel material 110, as all other layers of 2D material 110 discussed herein, can include a monolayer of atoms or molecules of any 2D material suitable for manufacturing transistor channels. On top of the first layer of 2D channel material 110 can be a first layer of nanosheet material (in the legend shown as 115), on top of which can be a second layer of 2D channel material 110, on top of which can be a second layer of dielectric 105. In the implementations in which a transistor 100 is formed using only a single carrier nanosheet 115, such as for example in a transistor 100 having only one or two 2D channels 250, the stack layer can be completed at this step by placing a cap layer 120 on top of the second layer of dielectric 105.

However, since in the embodiment illustrated in FIGS. 1-9 transistor 100 includes two nanosheet 115 layers, instead of a cap layer 120 on top of the second layer of dielectric 105, a third layer of 2D material 110 can be deposited, on top of which a second nanosheet 115 layer can be deposited, on top of which a fourth 2D material layer 110 can be placed, on top of which can be a third layer of dielectric 105, on top of which a cap layer 120 can be placed to complete the stack. This layer stack can provide the material basis for fabricating transistor 100 that can include, for example, four 2D channels 250 that can be supported on the bottom and top surfaces of the two carrier nanosheets 115.

In the event that a transistor structure utilizing more than two carrier nanosheet layers 115 is contemplated, 2D materials 110, nanosheets 115, and dielectric layers 105, as described in the preceding paragraph, can be added on top of the third layer of dielectric 105 in the same or similar order, thus providing a stack of materials comprising any number of N nanosheets 115 along with their corresponding 2D material 110 layers.

In the stack provided in FIG. 1, carrier nanosheets 115, which can also be referred to as nanosheets layers 115, can comprise an epitaxially grown silicon, or any other semiconductor or any dielectric material. Nanosheet layer 115 can include a combination of semiconductor and dielectric materials. Nanosheet layers 115 described herein can provide a structural support for the 2D material layers 110 which can be formed on the surface of a carrier nanosheet 115 as a monolayer of atoms or molecules. In some embodiments, nanosheet layer 115 can support thereon a layer of 2D material 110 that includes multiple layers of atoms or molecules. Nanosheet 115 material can act as a seed layer for growing, depositing or applying a layer of 2D material 110 thereon. Layers of dielectric 105 and nanosheet 115 materials used herein can have a thickness that is larger than that of the 2D material layers 110. For example, a layer of nanosheet 115 or dielectric 105 can have a thickness that is 1, 2, 3, 4, 5, 10, 15, 20 or 30, 50 or 100 times larger than the thickness of the 2D material 110. Nanosheet 115 layer can have any thickness that provides sufficient structural support for the 2D material 110 for the steps of the fabrication and use, including for example a thickness that is up to 1, 2, 3, 4, 5, 6, 7, 8, 9, 10, 12, 14, 16, 18 or 20 nm. Carrier nanosheet 115 can also include a thickness of greater than 20 nm, such as 25, 30, 40, 50 or 100 nm, depending on the contemplated structure.

In the implementation described with regard to FIG. 1, the number of nanosheet 115 layers N=2, i.e., and in which layers of 2D materials 110 can be used to provide up to N=4 2D channels 250. The 2D material layer 110 maybe be provided on only one side or on any of the sides of the nanosheet or may be provided without a carrier nanosheet. The stack may be provided with a capping layer 120 comprising resist, dielectric or other suitable material. The 2D material 110 may be precisely deposited on an insulative carrier nanosheet 115 layer to enable a very low Dt integration build of horizontal nanosheets with high performance.

As shown for example in FIGS. 2A-2C, the layers can be masked with a PR mask, using a photoresist (PR) or other suitable material, and etched to at least partially define the region where source/drain (hereinafter also referred to as the "S/D") structures can be formed. In each of the steps the mask can then be removed.

Figure 2A:
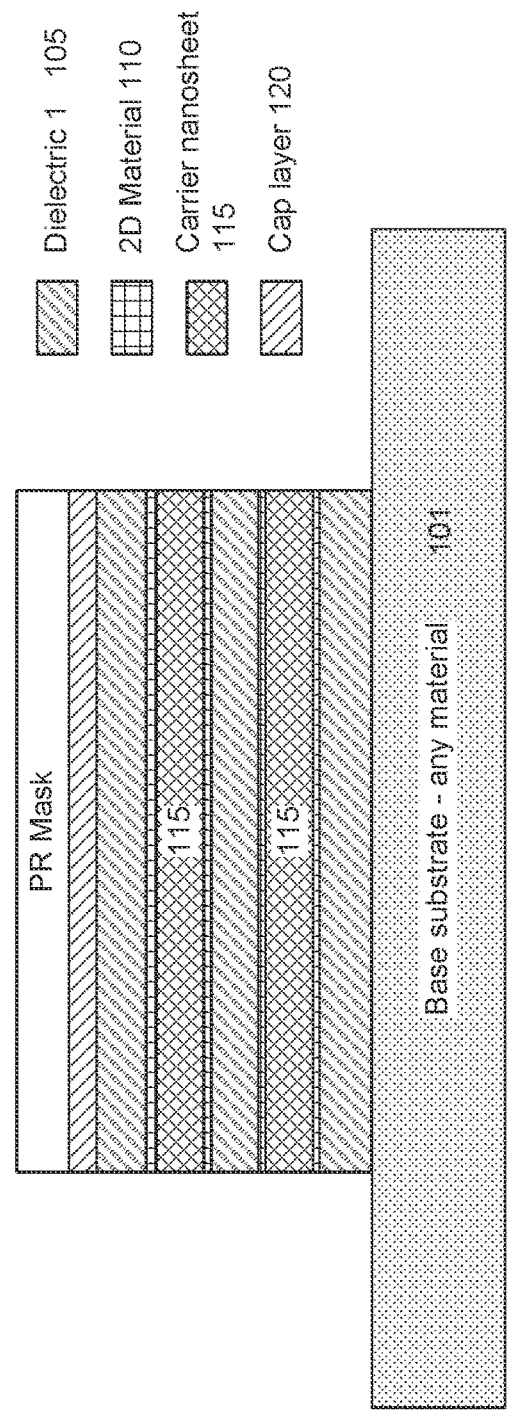
Figure 30:
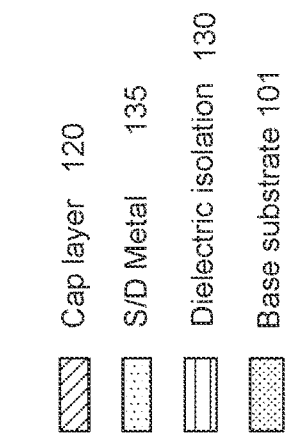
Figure 30:
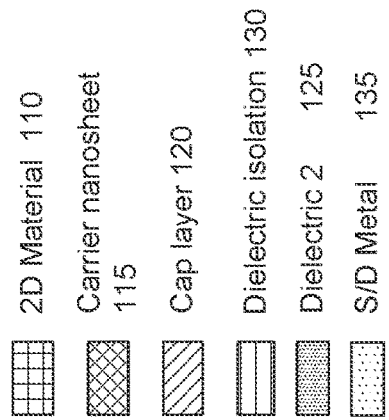
Figure 30:
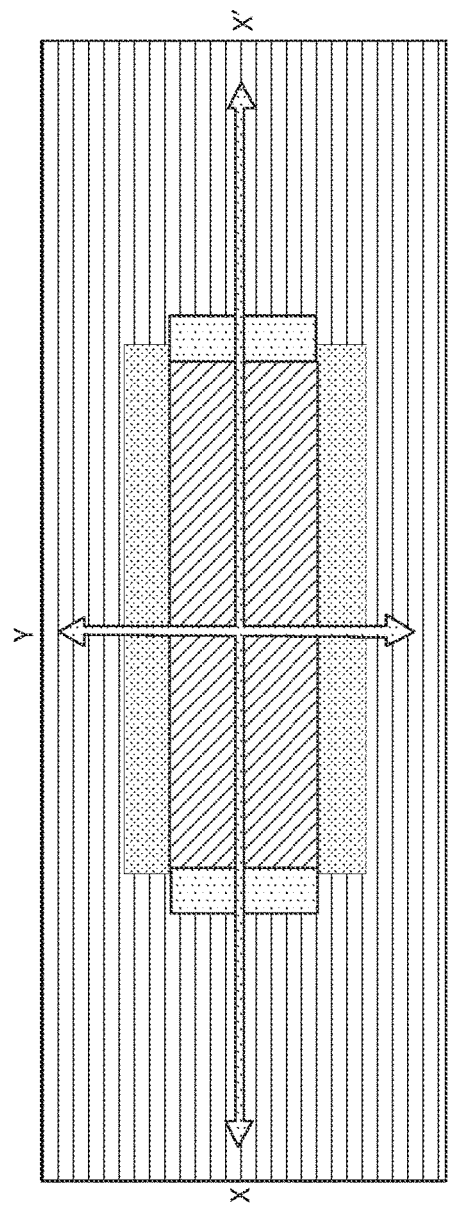

In FIG. 2A a PR mask can be used on top of the portion of the material stack that will be preserved in order to etch out the surrounding areas. The surrounding areas that can be etched out can include areas at two opposing ends of the material stack, as shown in FIGS. 2A-C, such as for example illustrated in the top-down view in FIG. 30. However, the surrounding areas can also be etched out on all four sides of the stack (not illustrated).

Figure 2B:
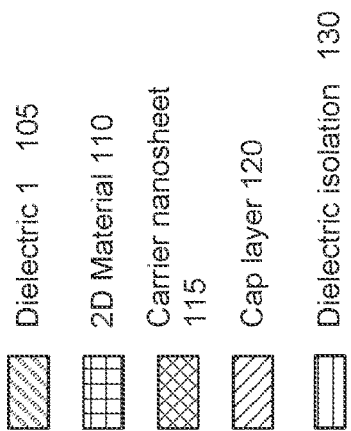
Figure 2B:
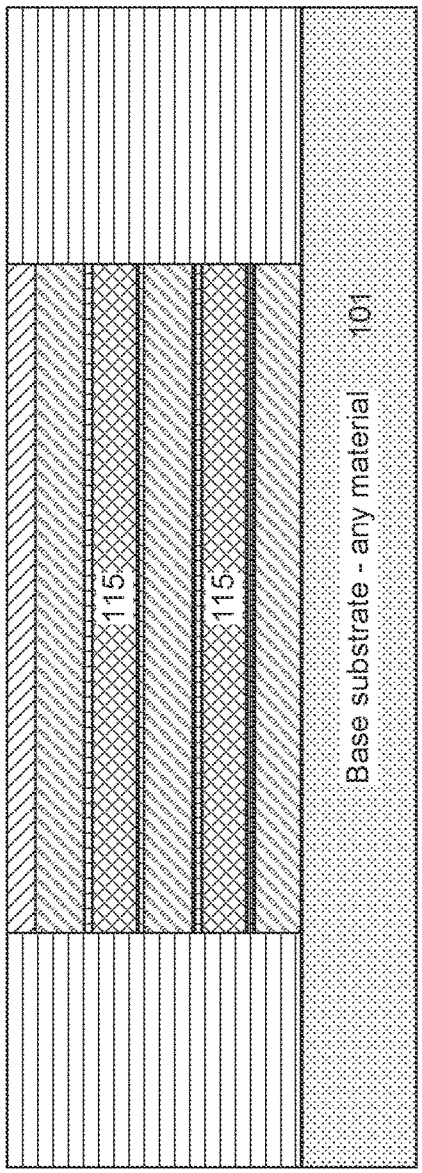
Figure 2C:
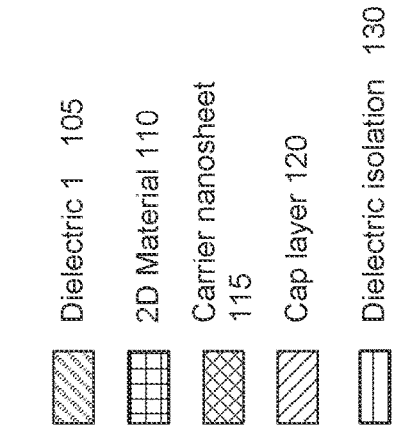
Figure 2C:
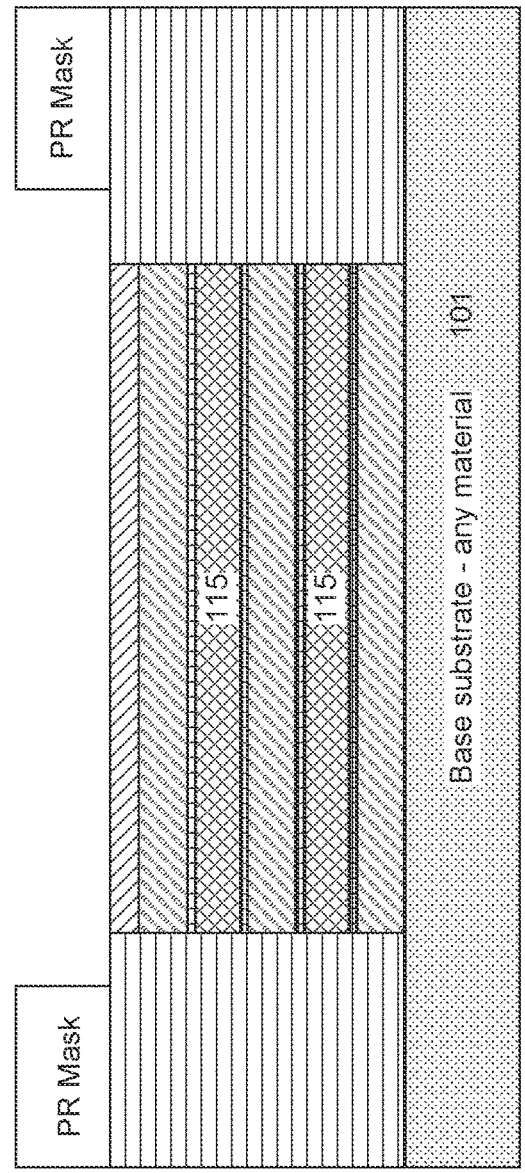

In FIG. 2B, the etched out area surrounding the preserved stack can be filled with a dielectric isolation 130. In FIG. 2C, a PR mask can be used on the dielectric isolation 130 near each side of the stack in order to prepare for and implement the selective etch through the dielectric isolation 130 down to the substrate. This etch can be implemented at the two distal ends of the structure. The etched channel can then be used for S/D structures 215 and 220 to be implemented at the two distal ends of the structure.

Figure 3:
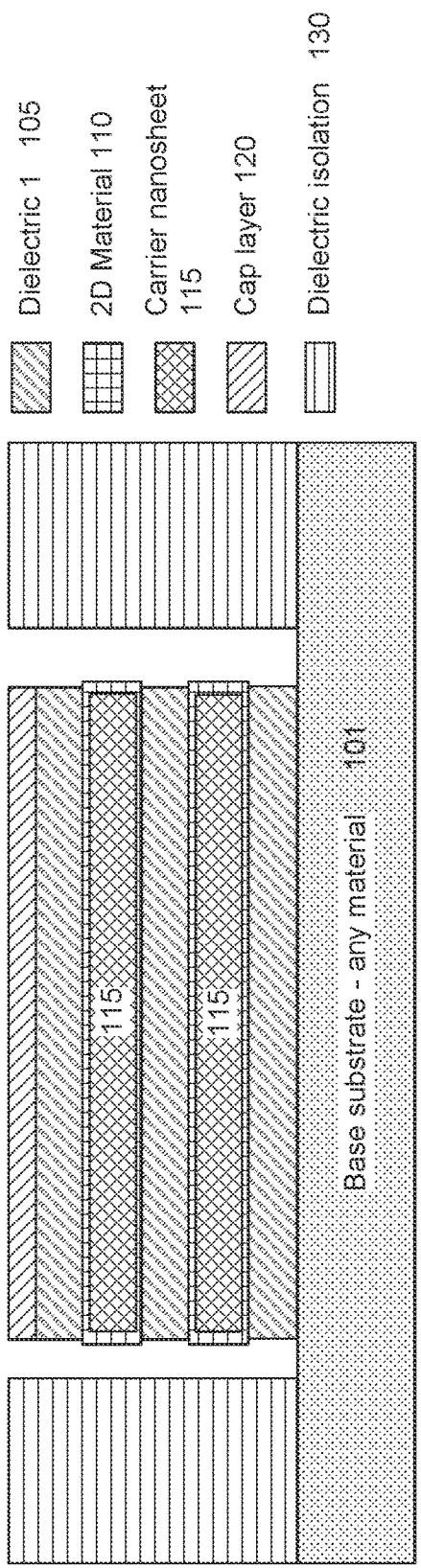

FIG. 3 depicts for example the step in which 2D material 110 layer can be selectively formed on the exposed sidewall portions of the nanosheet layers 115. The exposed sidewall portions of nanosheet layers 115 can be exposed by the etch prepared in connection with FIG. 2C in which the etched channel can be created on the left and right sides of the structure between the dielectric isolation 130 and the layer stack using the PR masks and directional downward etching.

Once the channels on either side of the stack are etched out, the exposed edges of the carrier nanosheet layers 115 can be used as a seeding layer for depositing, growing, or otherwise applying a layer of 2D material 110 therein. After 2D material 110 is applied on the exposed sidewall portions, the 2D material 110 can encircle, enclose, envelop, surround or cover the exposed nanosheet with 2D conductive material. As a result, 2D material 110 can, in some embodiments, entirely surround, cover or envelop the nanosheet layer 115, covering its bottom surface, the top surface and all four edge surfaces of each carrier nanosheet layer 115. In some embodiments, 2D channels 250 can be formed on each surface of the nanosheet 115 covered by 2D material 110 and spanning between the two distal ends of the structure, where S/D structures 215 and 220 are to be formed.

In some embodiments, 2D material 110 can partially surround or cover the first and the nanosheet 115 layers. For example, when the first or the second carrier nanosheet 115 is shaped as a cuboid with six rectangular sides (although it can have any shape, including those not illustrated herein) the 2D material 110 can cover, surround, or otherwise be applied to a subset of the six sides or surfaces of the carrier nanosheet 115. This can include, for example, any one or more of the six surfaces of the carrier nanosheet 115, such as the bottom surface, the top surface and the two surfaces at the two distal ends of the carrier nanosheets 115 onto which S/D metal layers 135 are to be deposited to form the S/D structures 215 and 220. Adding more 2D material 110 at the edges of the carrier nanosheets 115 can provide a larger area for transistor channels 250 and the electrically conductive contact. It can also add more contact area between the 2D material and regions in which S/D metal 135 can be deposited to form S/D structures 215 and 220.

Figure 4:
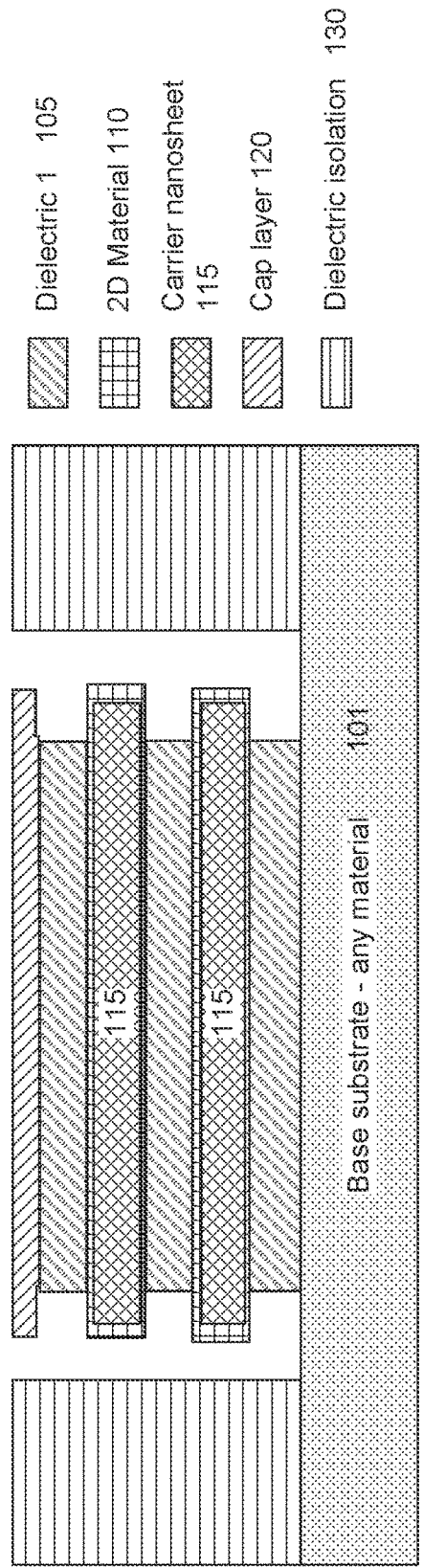

As shown in FIG. 4, the dielectric layers can be selectively etched to form indented surfaces with regard to the 2D material formed on the sidewall portions of the carrier nanosheets 115. Following the selective etch of the dielectric 105 layers above and below carrier nanosheet a space can be opened for insulating dielectric material (i.e., insulators 240 and 245) to prevent electrical shorting between the gate structure 235 and S/D structures 215 and 220.

Figure 5:
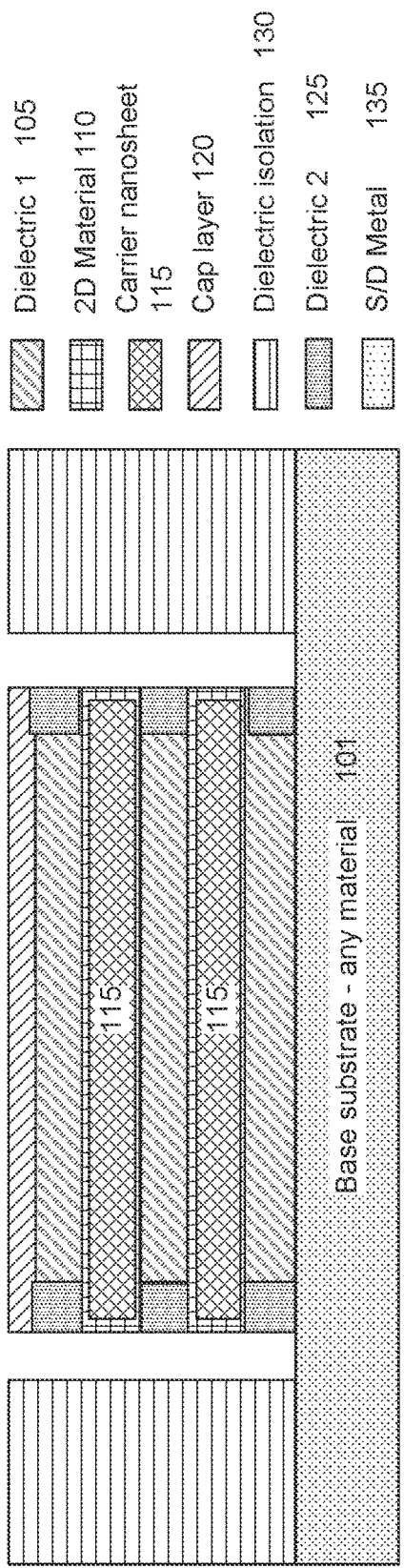

As shown in FIG. 5, a dielectric material (in the legend shown as dielectric 125) can be deposited or filled into the areas from which dielectric 105 was etched in the steps described in connection with FIG. 4. This can be accomplished by filling in the dielectric 125 into the channels etched in FIG. 4 and then directionally etching down the dielectric 125. This can be accomplished, for example, using the same or similar techniques as those used in the etching in connection with FIG. 2C and FIG. 3. As a result, the portions of the dielectric 105 that were etched around the ends of the carrier nanosheets 115 can be then be filled with dielectric 125 such that the outer edges of the dielectric 125 fillings are aligned with the cap layer and with the 2D material 110 on the sidewalls of the carrier nanosheets 115. Dielectric 125 can thereby provide electrical insulation between the to-be-formed gate structures 235 and the to-be-formed S/D structures 215 and 220.

Figure 6:
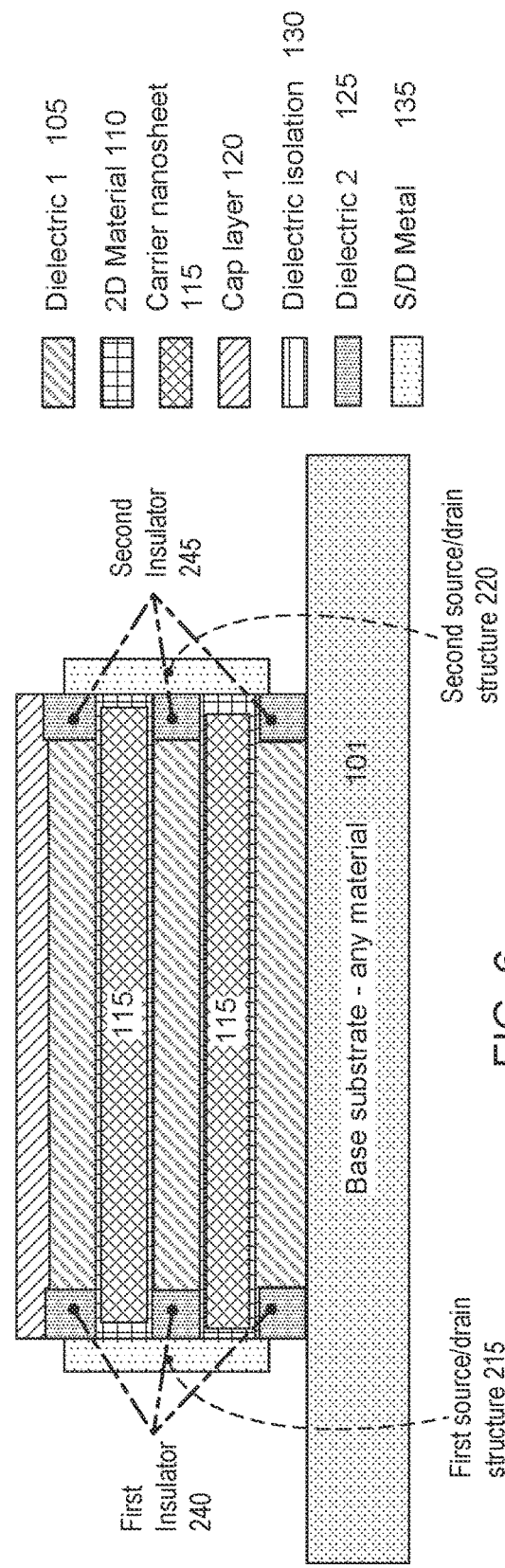

As shown in FIG. 6, the source and drain regions (S/D structures 215 and 220) can be formed for example by selectively depositing S/D metal 135 on the exposed portions of the 2D material 110 in the etched channels of FIG. 5. S/D structures 215 and 220 can be formed by a deposition process and etched as necessary to form the S/D metal layers at opposing ends of the channel region.

Figure 7:
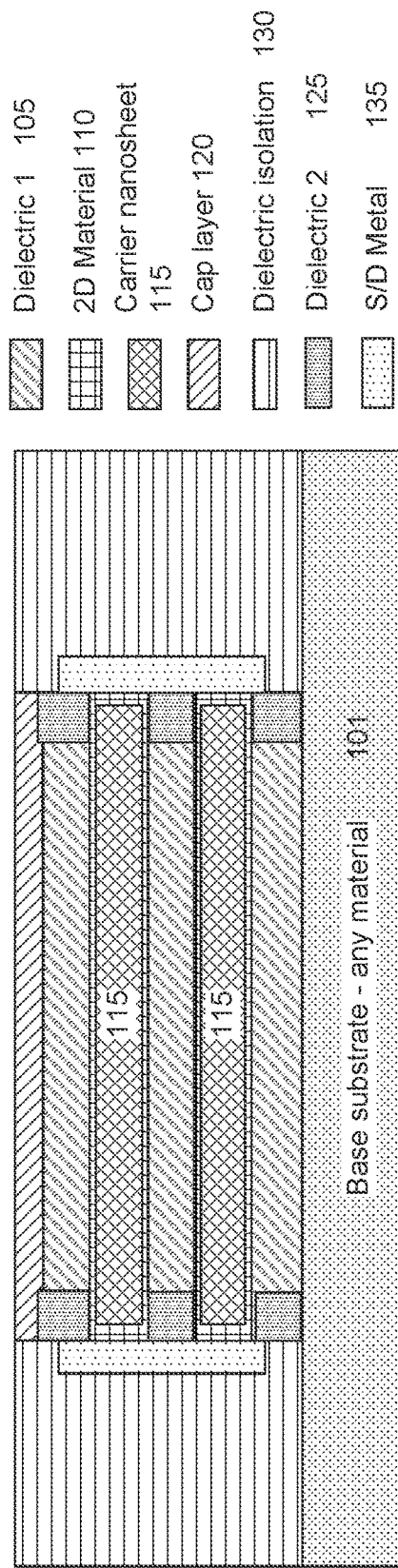

As shown in FIG. 7, a dielectric isolation 130 material can be formed beside the material stack using the same or similar steps as completed in connection with FIGS. 2A-2B. Following the forming or deposition of dielectric isolation 130 the structure and the surrounding material can be CMP polished back to the cap layer 120.

Figure 8:
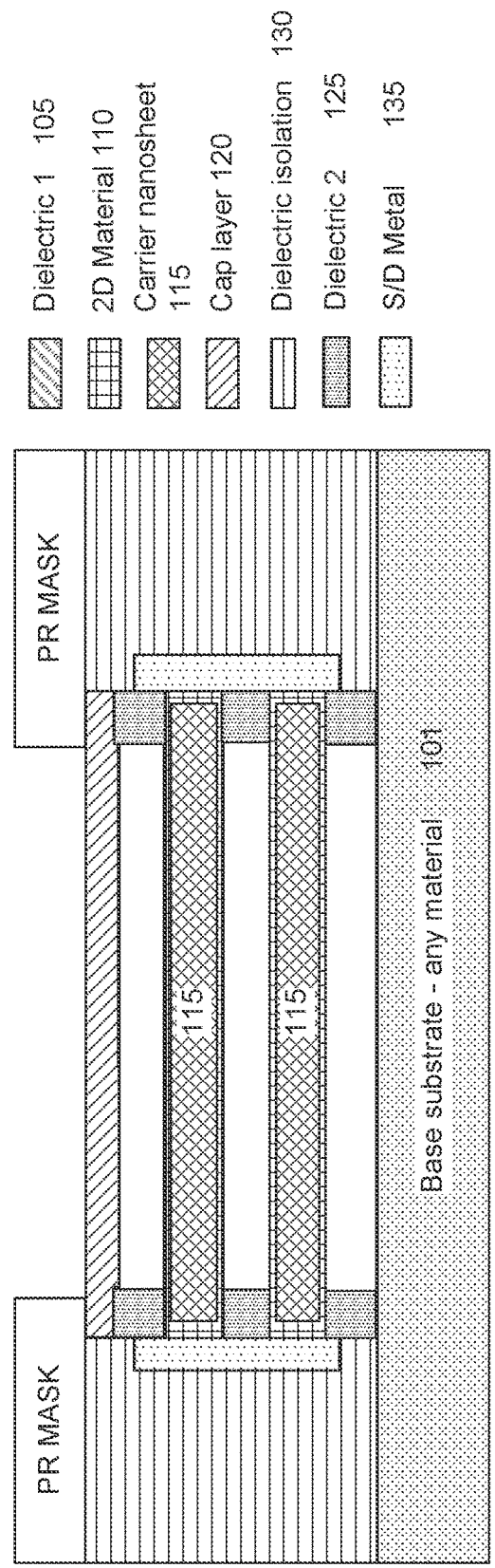

As shown in FIG. 8, a mask can be formed over the dielectric isolation in such a way as to expose for etching all dielectric 105 layers in the stack. This can involve forming one or more access trenches on one or both of the sides of the channel region than the sides upon which the S/D structures 215 and 220 abut. The dielectric layers 105 can be removed through the one or more access trench openings using a selective etch process for selectively removing dielectric 105. In some embodiments, dielectric 105 can be a sublimatable material, such as ashless carbon (ALC) for example, in which case increasing the temperature can cause the material to sublimate and therefore be removed from the transistor 100 structure through a phase change from a solid to a gas.

If a GAA structure is desired, 2D material 110 can be deposited on the exposed sidewall surfaces of the carrier nanosheet. For example, this can be done in the event that the 2D material 110 is damaged during the etch process in connection with FIG. 8. A PR mask can be added to allow for creating of the gate structure 135, which can include high-k gate 140 material and gate metal 145.

As shown in FIG. 9, a high-k gate 140 material can be selectively deposited on exposed portions of the 2D material 110. For example, high-k gate 140 material can be selectively deposited on the sidewall surfaces of the carrier nanosheets 115 on top of 2D material 110. A gate metal 145 can then be formed on exposed gate high-k dielectric 140 to complete the GAA gate structure 235. Routing can then be provided according to conventional techniques to connect the source, gate and drain structures to a circuit or a device of which the transistor 100 can be a part.

In some embodiments, gate structure 235 can surround all outer surfaces of the central portion of the carrier nanosheets 115 between the S/D structures 215 and 220. For example, the central portion of the carrier nanosheet 115 and its 2D channels 250 that the gate structure 235 surrounds or envelops can include any length of the carrier nanosheets 115, such as up to 10%, 20%, 30%, 40%, 50%, 60%, 70%, 80%, 90%, 95% 99% or 100% of the length of the carrier nanosheets 115 spanned between the S/D structures 215 and 220. In some embodiments, other than a GAA design, the gate structure 235 can interface or partially surround some of the surfaces of the carrier nanosheets 115 and their corresponding 2D material 110 layers, such as any combination of one or more side walls, or bottom or top surfaces of carrier nanosheets 115.

Figure 10:
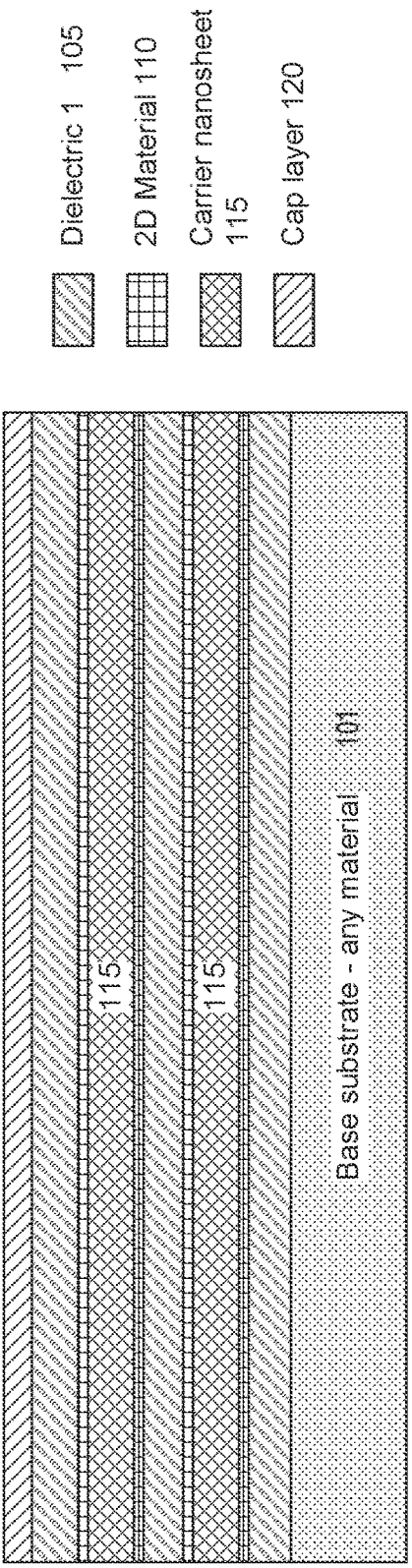

In some embodiments, a different method of formation may utilize a selective inner spacer (i.e., a spacer that is selectively deposited within the etched regions around the carrier nanosheets 115) that can be self-aligned to electrically insulate the S/D structures 215 and 220 from the gate electrode structure 235. As shown in FIG. 10, a stack of materials can be formed to be the same or similar to the one discussed in connection with FIG. 1. This can be the starting point of a method or process of fabricating or forming transistor 100 using the selective inner spacer.

Figure 11:
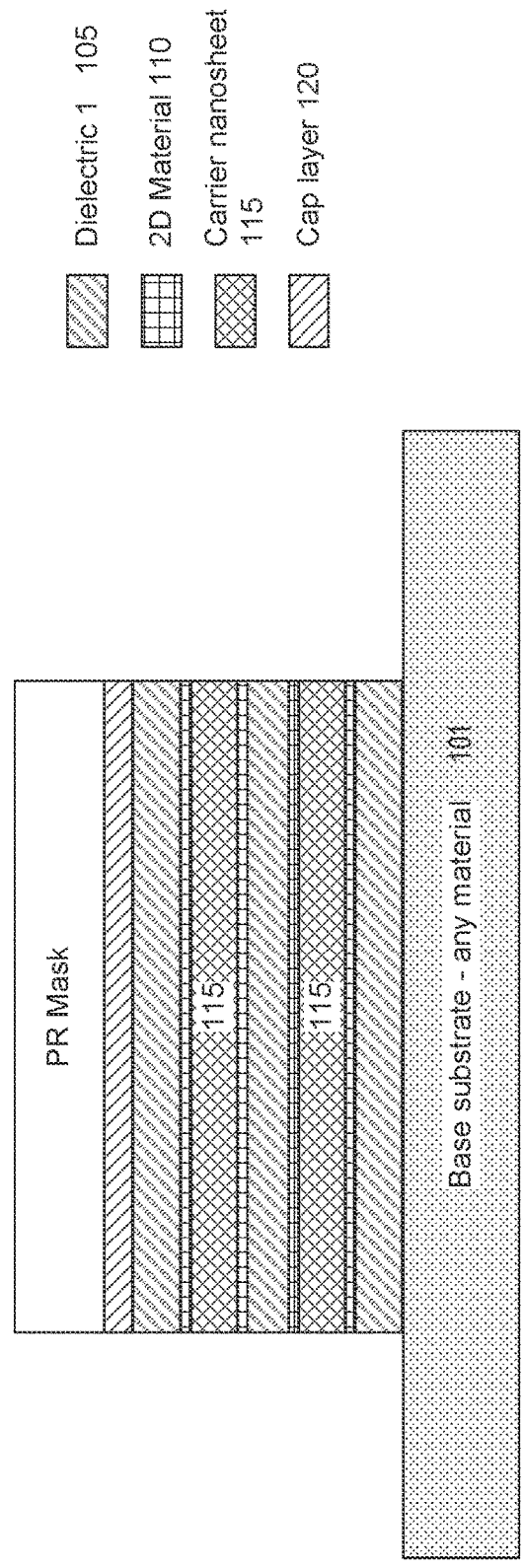

As shown in FIG. 11, mask and etch steps can be performed to generally define the portion of the layer stack from which transistor 100 structures, including the future S/D structures 215 and 220, can be formed. The PR mask can be the same or similar to the one used in FIG. 2A.

As shown in FIG. 12, an etch can be perform to indent dielectric 105. This can be implemented using the same or similar process to the one used in connection with FIG. 4 and its preceding steps, such as those discussed in connection with FIGS. 2C and 3, in order to etch the dielectric 105 around the outer edges of the nanosheets 115 and form carrier nanosheets 115. In this method, 2D material 110 does not have to be deposited on the exposed sidewall of the nanosheets 115. In some embodiments, 2D material 110 can be deposited on the sidewalls of the nanosheets 115.

As shown in FIG. 13, a conductor, such as an S/D metal 135 can be deposited by a technique, such as ALD. The metal can be formed substantially over any exposed base substrate 101, cap layer 120, etc. A directional etch may then be used to remove the excess metal leaving metal only in the region in which S/D structure 215 and 220 are to be implemented. This can be done using a directional etch along with same or similar steps as those described in connection with FIGS. 4-5, except that in this case, S/D metal 135 is being deposited instead of dielectric 125.

Figure 14:
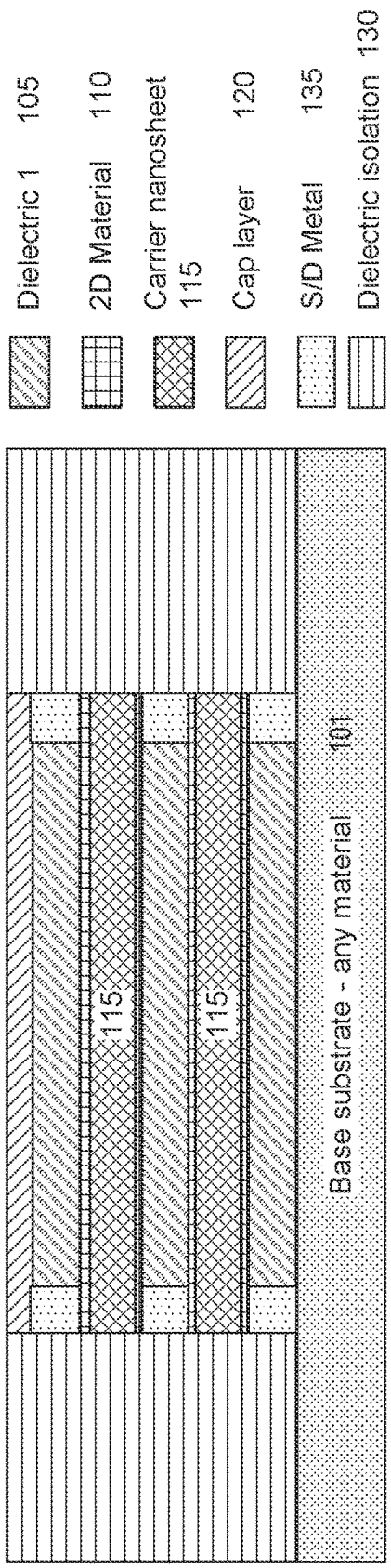

As shown in FIG. 14, dielectric isolation 130 can be formed around the transistor structures. This can be done using the same or similar steps as those discussed in connection with FIG. 7. CMP can be used to align the upper surface of the dielectric isolation 130 with the cap layer 120.

Figure 15:
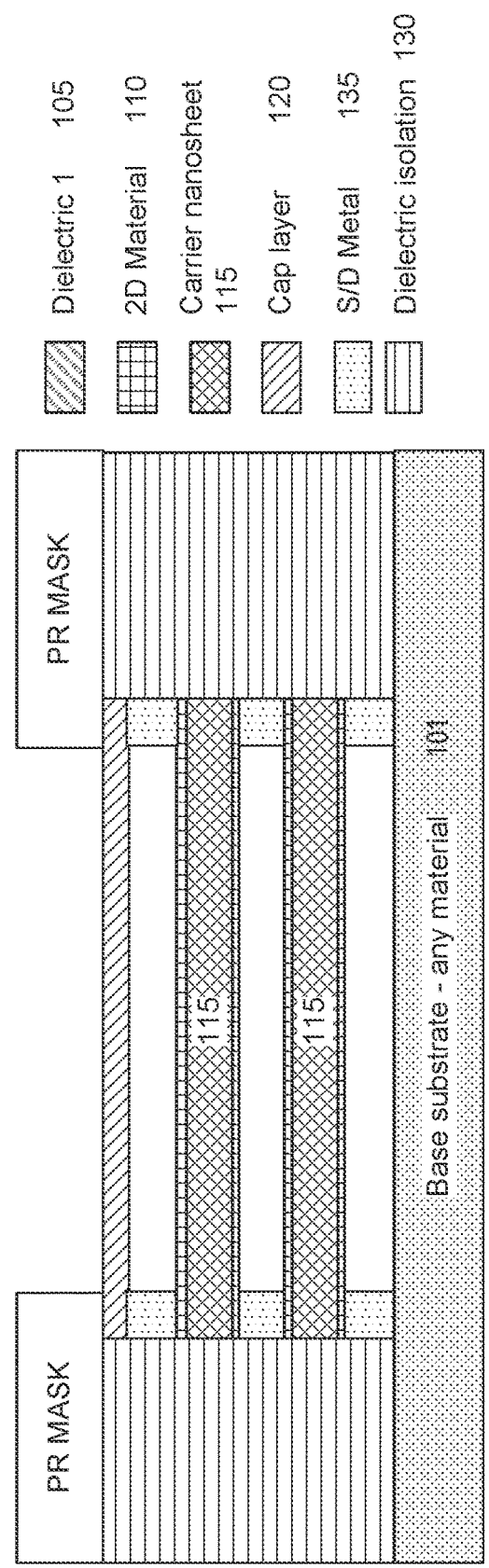

As shown in FIG. 15, PR mask and etch steps can be used to create a trench or opening in the isolation dielectric 130 adjacent the transistor 100 structure in order to expose sidewall of the carrier nanosheets 115. Dielectric 105 can be etched out or removed. An isotropic etch can be utilized to remove the dielectric 105 thus leaving the carrier nanosheets 115 with 2D material 110 on at least one surface, and potentially on up to four sides or surfaces of the carrier nanosheet 115 between the S/D metal deposited layers 135. Etching of dielectric 105 can be done using the same or similar steps or techniques discussed in connection with FIG. 8. As with the embodiments discussed in connection with FIGS. 1-9, dielectric 105 can be selected so that it can be etched without significantly affecting or etching the 2D material 110 or other layers in the stack. Dielectric 105 can also be a sublimatable material, such as ashless carbon (ALC) for example, in which case increasing the temperature can cause the material to sublimate and turn from a solid to a gas.

As shown in FIG. 16, the photoresist used to form the trench can be removed. A selective deposition process can be used to deposit dielectric 125 and form a first insulator 240 and the second insulator 245 between the S/D structures 215 and 220 and the gate structure 235 to be completed. This can be done for example without depositing dielectric 125 on the carrier nanosheets 115. It can be done by depositing the dielectric 125 on the interior region of the air gap adjacent to the S/D metal 135.

As shown in FIG. 17, high-k gate 140 dielectric can be formed or deposited on the 2D material 110 of the carrier nanosheets 115. In some instances, high-k gate 140 can be deposited or formed on dielectric 125. A gate metal 145 can then be deposited onto high-k gate 140. The gate structure 235 can be formed so as to be common to both carrier nanosheets 115 and all 2D channels 250 regions in the structure, thus providing increased gate surface area and performance of the transistor 100.

Figure 18:
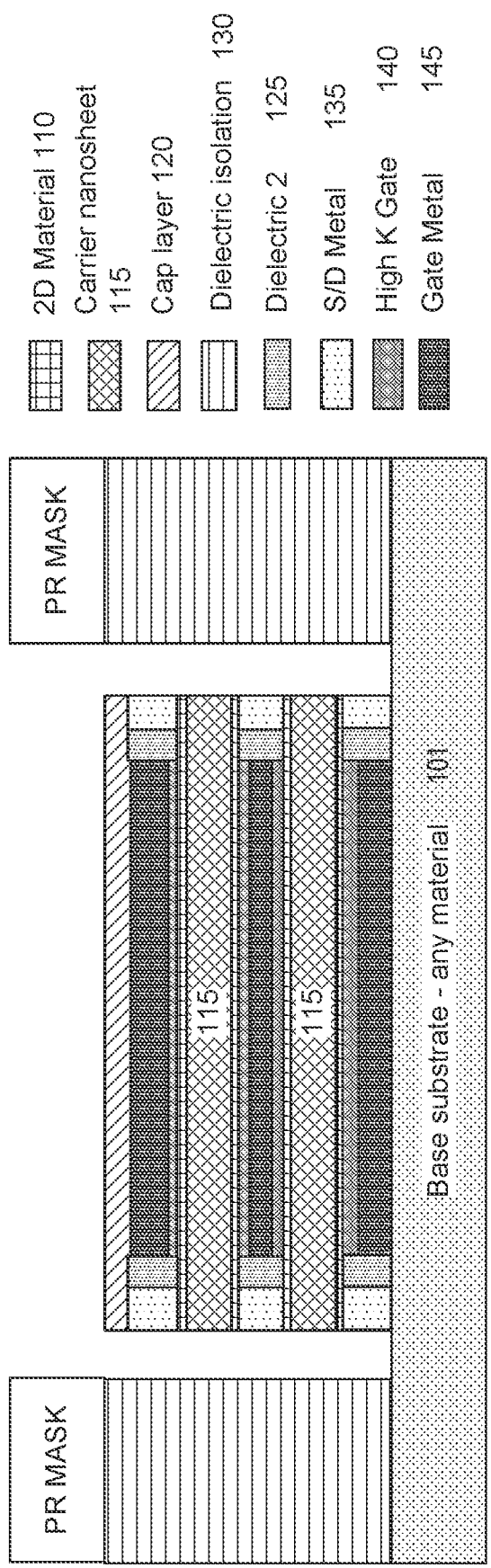

As shown in FIG. 18, a PR mask/etch process can be utilized to open up a region in the dielectric isolation 130 that abuts the stack. A directional downward etch can be done to open the space for connecting S/D metal 135 regions together to complete the formation of the S/D structures 215 and 220. The steps this etch can use the same or similar techniques as those described in connection with FIG. 2 or FIG. 5, for example.

Figure 19:
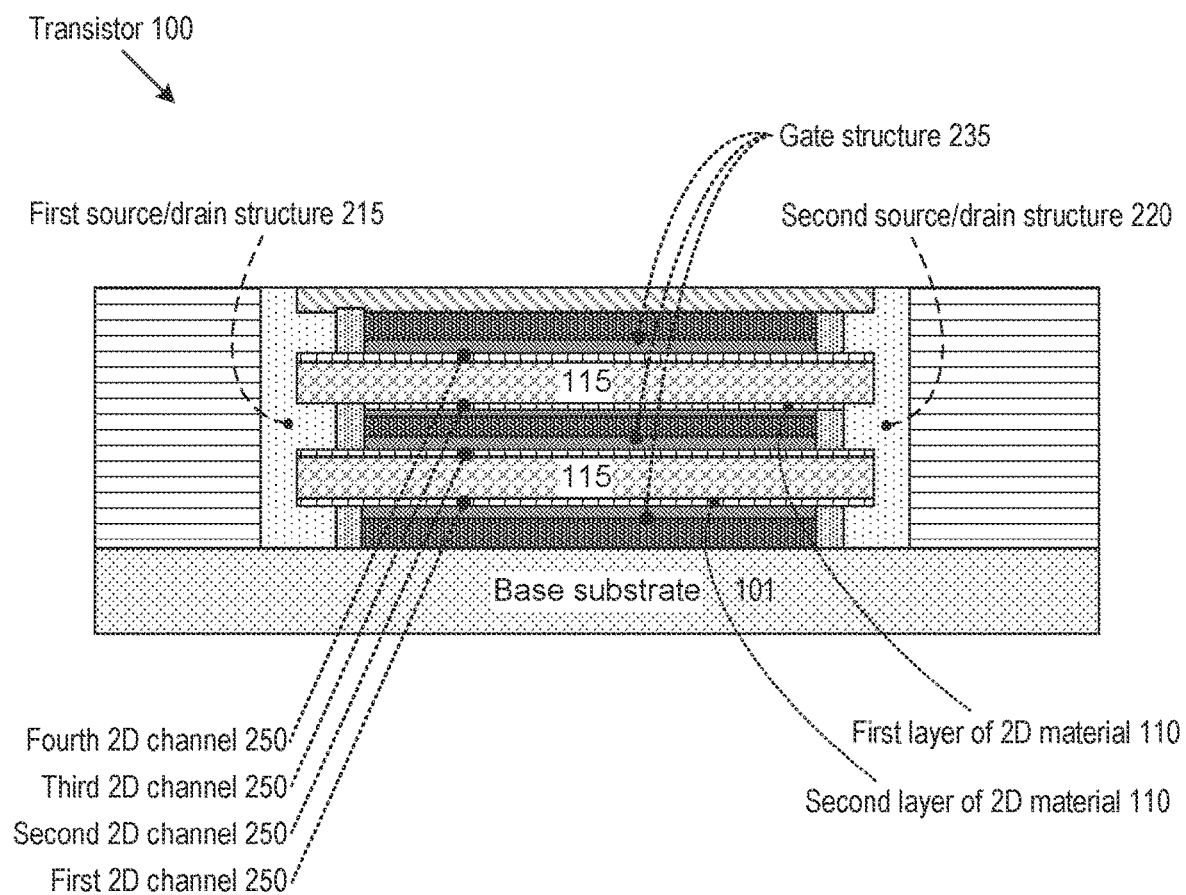

As shown in FIG. 19, the photoresist can be removed followed by an added S/D metal 135 deposition to form first S/D structure 215 and second S/D structure 220. Following this, a CMP can be complete. The first and second S/D structures 215 and 220 and gate structure 235 can then be coupled to a circuit or a device of which transistor 100 can be a part, according to conventional techniques.

Structure formed in FIG. 19 can include the same or similar functionality as the one illustrated in FIG. 9. Structure of transistor 100 in FIG. 19 can include a first carrier nanosheet 115 that is at least partially (or entirely) coated, surrounded, or otherwise enveloped by a first layer of 2D material 110 and a second carrier nanosheet 115 that is also at least partially (or entirely) coated, surrounded, or otherwise enveloped by a second layer of 2D material 110. The first nanosheet 115 can be formed above the substrate 101 and oriented horizontally and in parallel with respect to the substrate 101 and the second nanosheet 115 can be formed above the first nanosheet and oriented horizontally and in parallel with respect to both the substrate 101 and the first nanosheet 115. At or near the two distal ends of the structure are the first S/D structure 215 and the second S/D structure 220 comprising S/D metal 135, which can form the source and drain contacts that include sidewall structures that can extend vertically from the substrate. The transistor 100 also includes a gate structure 235 that envelopes or surrounds the first and the second layers of 2D material 110 around central portions of each of the carrier nanosheets 115. The gate structure 235 can comprise a high-k gate 140 material and gate metal 145 which can form a gate all-around (GAA) structure around the first and the second carrier nanosheets 115, similar to the way described in connection with FIG. 9. At or near the first distal ends of the first and the second carrier nanosheets 115 can be a first insulator 240 electrically insulating the first S/D structure 215 from the gate structure 235 while at or near the second distal end of the first and the second nanosheets 115 can be a second insulator 245 electrically insulating the gate structure 235 from the second S/D structure 220.

FIGS. 20-32 illustrate a process for fabricating 3D transistor 100 similar to those described above, but additionally demonstrate the use of a sublimatable material, also referred to as sublimation material. The process techniques illustrated can also use an alternative S/D metal 135 formation technique to complete first and second S/D structures 215 and 220 and the resulting transistor 100 structure.

Figure 20:
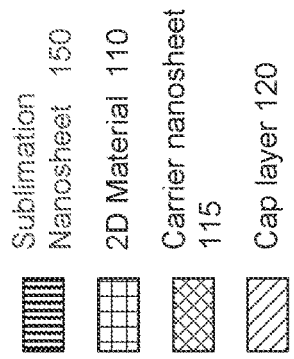
FIGS. 20-32 illustrate cross-sectional and top views of another example structure of a 3D transistor utilizing 2D material channels and sublimation nanosheets along with a set of fabrication steps for creating the same, according to one or more embodiments.
Figure 20:
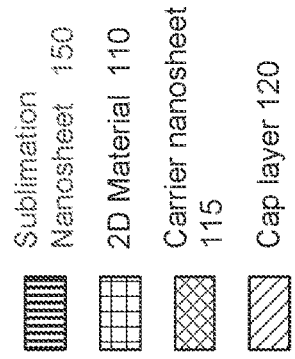
Figure 20:
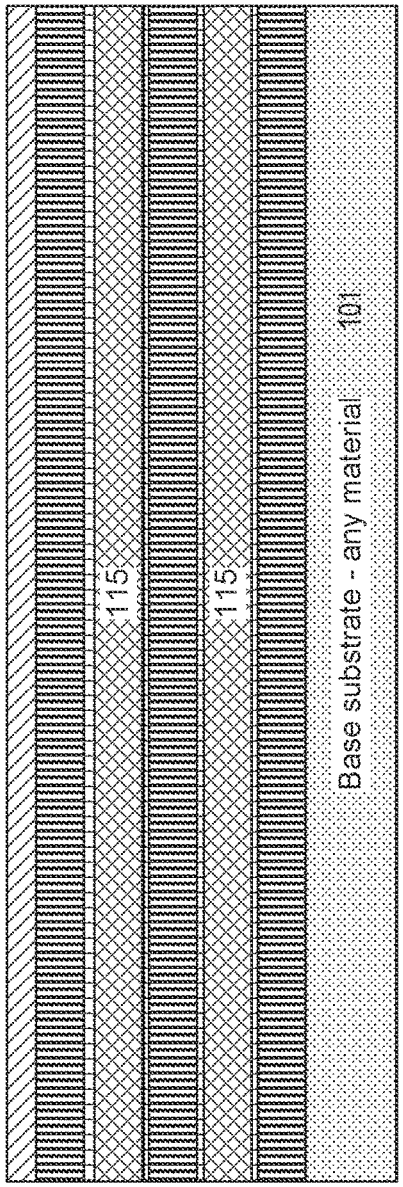

As shown in FIG. 20, a stack of material layers can be created to include a base substrate 101 on top of which can be a first sublimation nanosheet of sublimatable material (hereinafter also referred to as the "sublimation nanosheet"), which is identified in the legend as sublimation nanosheet 150. On top of the sublimation nanosheet 150 can be a first layer of 2D material 110 for creating a 2D transistor channel 250, on top of which can be a first nanosheet 115, on top of which can be a second layer of 2D material 110, on top of which can be a second sublimation nanosheet 150. In the event that a transistor 100 is fabricated with only a single carrier nanosheet 115 and including, for example, two 2D channels 250. At this step, a cap layer 120 can be applied to complete the stack.

Shown however in FIGS. 20-32 is an implementation with two carrier nanosheets 115, and so additional layers of 2D channel materials 110, nanosheets 115, and sublimatable nanosheets 150 are provided to make an N=2 tall stack of nanosheets 115 with surrounding 2D materials 110 for creating additional 2D channels 250. Specifically, on top of the second sublimation nanosheet 150 a third 2D material 110 layer can be applied, on top of which a second carrier nanosheet 115 can be applied, on top of which a fourth 2D material 110 layer can be applied, and on top of which a third sublimation nanosheet 150 can be applied. A cap layer 120 may be applied on top of the third sublimation nanosheet 150, thereby completing the material stack shown in FIG. 20.

The structure and processes illustrated in FIGS. 20-32 provide an example of a transistor 100 formed with two nanosheet structures 115 composed along with 2D materials 110 applied along their bottom and top surfaces. The 2D material 110 may be provided (i) on only one side or (ii) on any of the sides of the nanosheet 115. Alternatively, the 2D material 110 may be provided or formed without a nanosheet 115 and sandwiched between the sublimation nanosheets 150 without a carrier. The stack may be provided with a capping layer 120 comprising resist, dielectric, or other suitable material.

Figure 21:
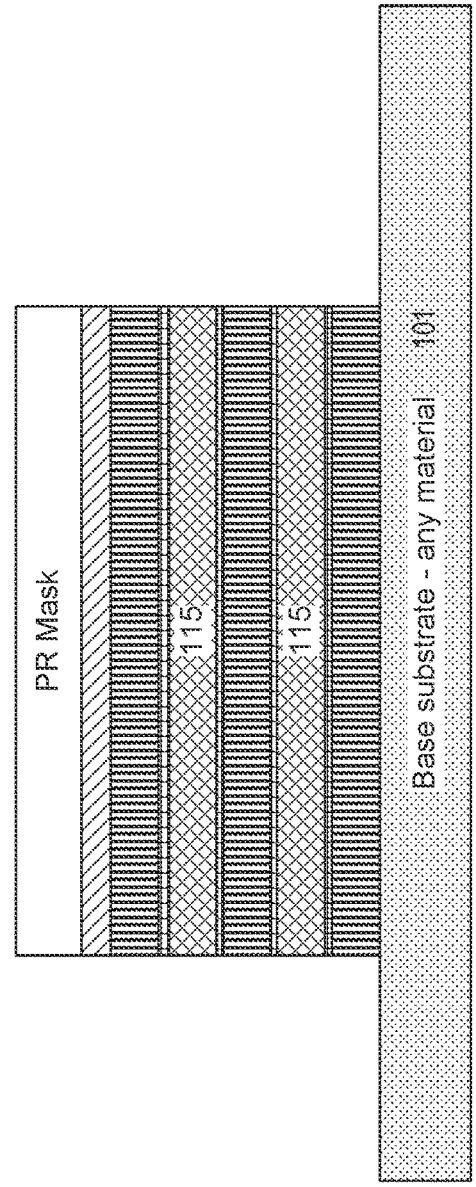

Shown in FIG. 21, for example, the stack layer can be masked with a PR mask protecting the portion of the stack, using a photoresist or other suitable material, to etch out the material to at least partially define the region where S/D metal 135 can be applied to form S/D structures 215 and 220. Once a directional etch of the regions at or near the distal ends of the structure is completed, a trench etched downward to the substrate 101 can be completed and the PR mask can be removed.

Figure 22:
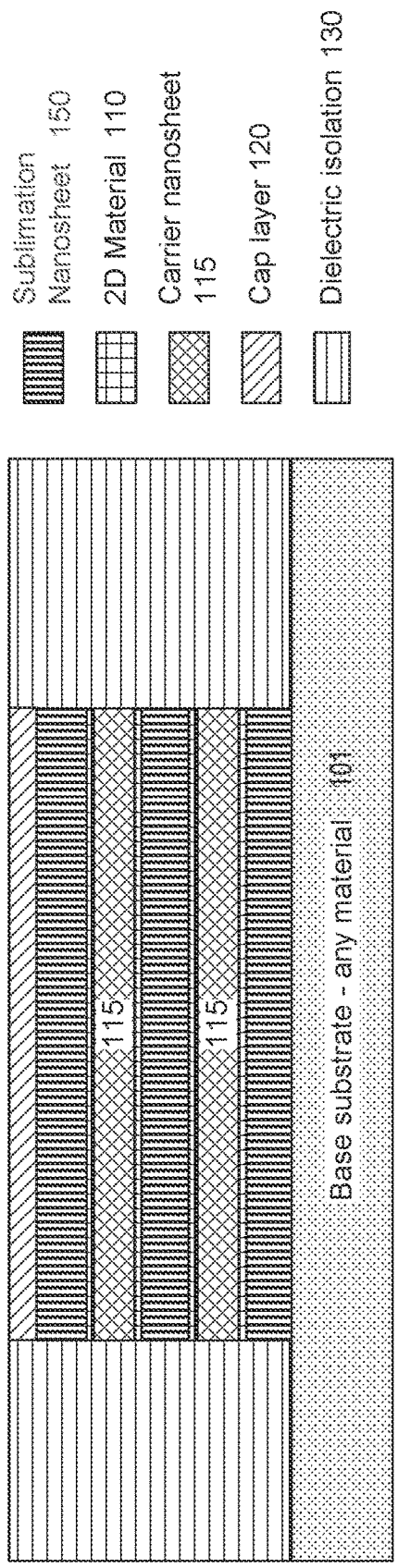

As shown in FIG. 22, a layer dielectric isolation 130 can be deposited beside the stack layer and etched back or processed via a CMP to align with the cap layer 120. Following the application of dielectric isolation 130, dielectric 130 can be aligned with the 2D material 110 on the sidewalls of the nanosheets 115.

Figure 23:
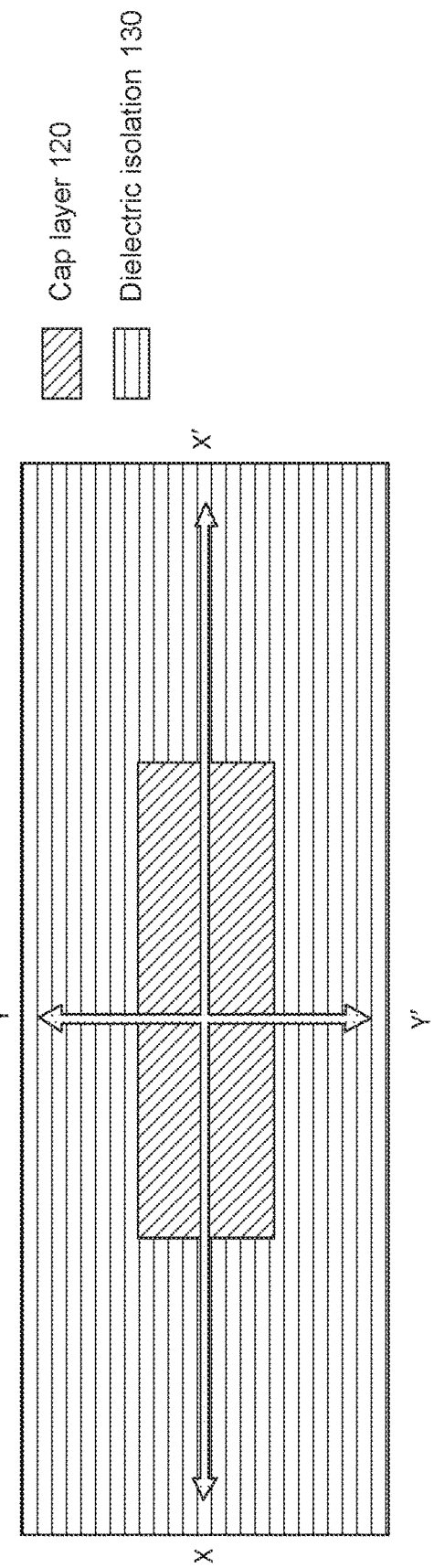

FIG. 23 shows a top view of the general outline of the structure showing the capping layer 120 and the surrounding isolation 130 around the stack layer in which transistor 100 is being formed. This illustration can correspond to an example view in the part of the process before directional etch is implemented at distal ends in which S/D structures 215 and 220 are to be formed.

Figure 24:
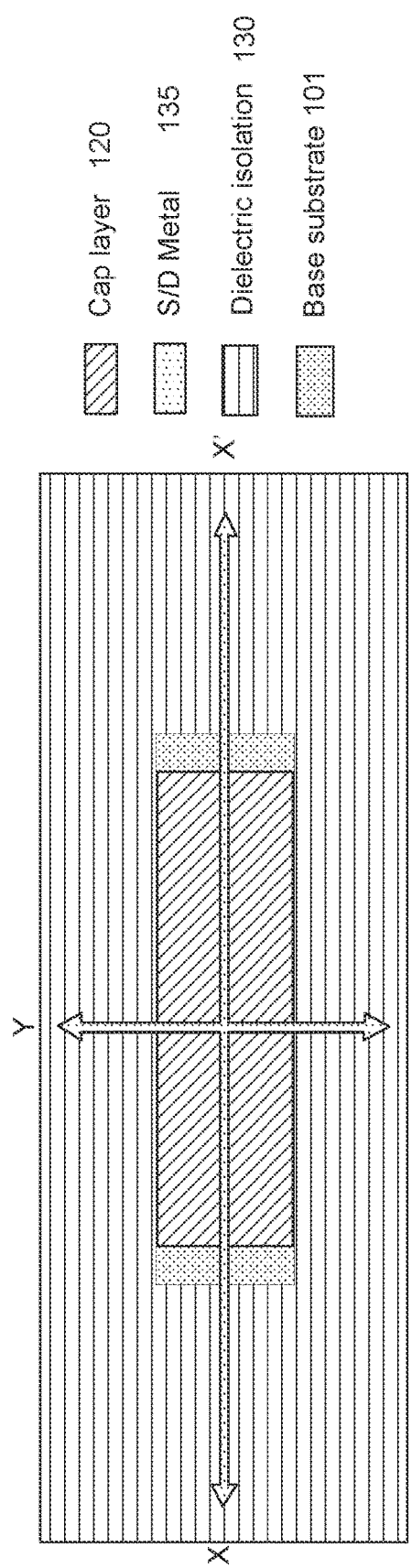

FIG. 24 depicts another top view of the structure that shows openings being formed by masking (not shown) and etching to form the region in which the S/D structures 215 and 220 are to be formed. The etching can be implemented downward from the top of the dielectric isolation 130 to the base substrate 101, thereby abutting the two distal ends of the stack.

Figure 25:
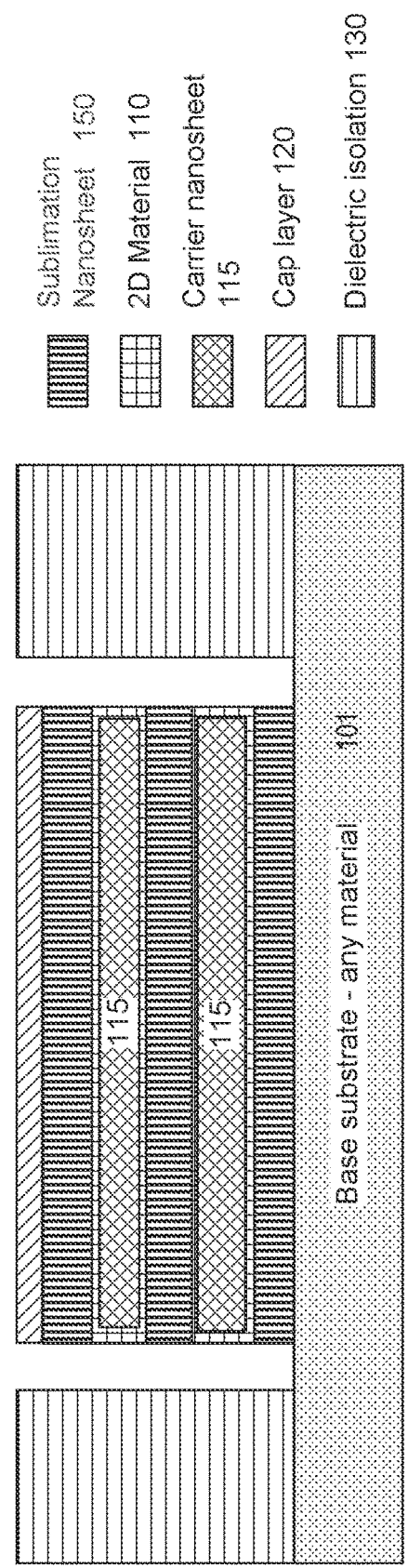

FIG. 25 shows a side view of the openings and the step in which 2D material 110 layer can be selectively formed, such as by growing or depositing, on the exposed sidewall surface of the nanosheet 115 layers inside of the etched cavity. This can be done using the same or similar techniques such as those implemented in connection with FIG. 3, for example.

Applying 2D material on the exposed sidewall portions of the nanosheet 115 can encircle, enclose, surround, or further cover the exposed nanosheet 115 with 2D material 110, thus resulting in the carrier nanosheets 115 being entirely enclosed, surrounded, or enveloped by the layer of 2D material 110. This application of 2D material on the nanosheet 115 can provide a larger contact area between the 2D material and to-be-deposited S/D metal regions (e.g., regions in which S/D structures 215 and 220 are to be formed). The steps and techniques used here can be the same or similar as those used for example in connection with FIG. 18.

Figure 26:
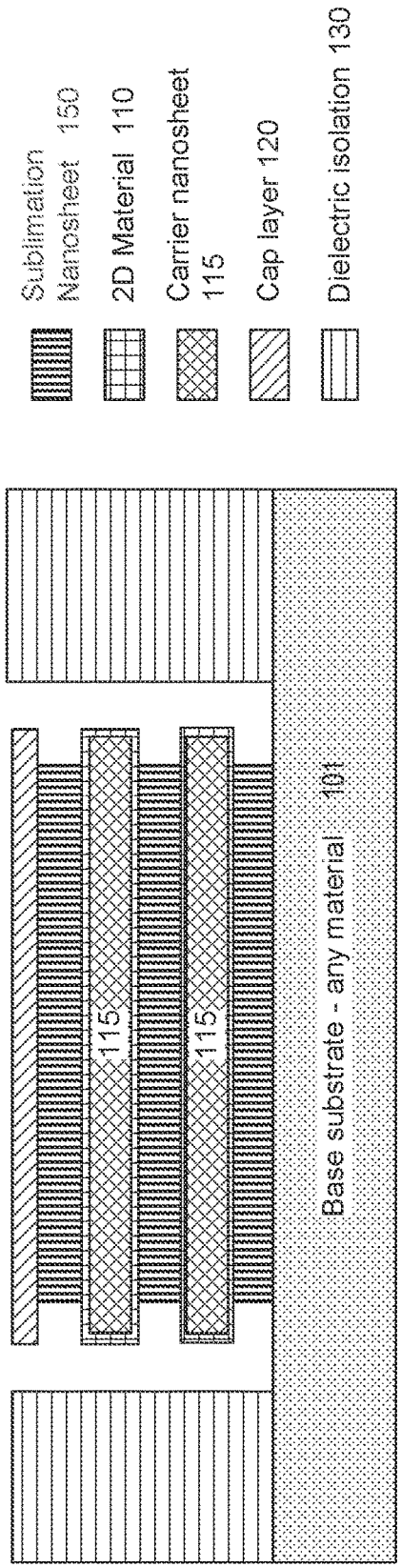

As shown in FIG. 26, the sublimatable nanosheets 150 can be partially sublimated along the edges so as to form indented surfaces with respect to the 2D material 110 layers formed on the sidewall portions of the carrier nanosheets 115. The steps and techniques implemented here can, for example, be same or similar to those implemented in connection with FIG. 4, except that the sacrificial layer in FIG. 4 was a dielectric 105 that was partially indent etched, whereas in FIG. 26 it is a sublimatable layer that can similarly be partially sublimated so as to be indented.

Figure 27:
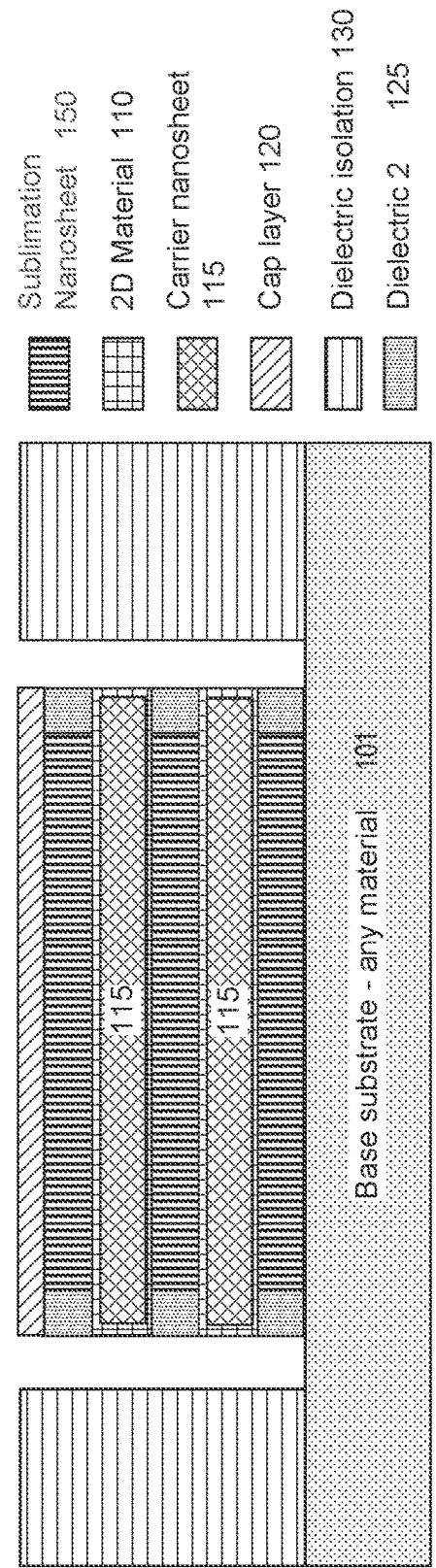

As shown in FIG. 27, a layer of dielectric 125 can be deposited into the etched out cavities and then etched back using a hard mask to make flush or align with the cap layer as well as with the 2D material 110 on the sidewalls of the carrier nanosheets 115. The deposited dielectric 125 can provide electrical isolation of the to-be-formed gate structures 235 from the to-be-formed S/D structures 215 and 220.

Figure 28:
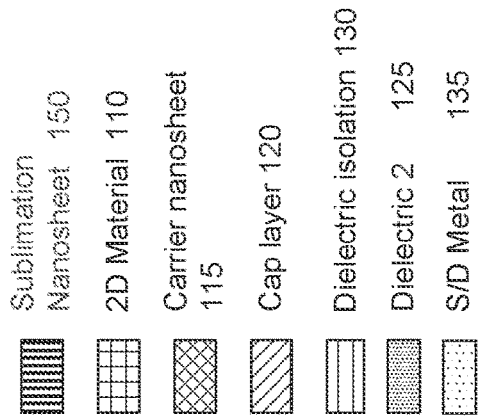

As shown in FIG. 28, a first S/D structure 215 and the second S/D structure 220 can be formed by depositing S/D metal 135 into the etched out opening. The first and second S/D structures 215 and 220 can therefore form the source and drain contacts of the transistor 100. The S/D metal 135 can create an electrical contact with the 2D material 110 on the outer surface of the carrier nanosheet 115.

Figure 29:
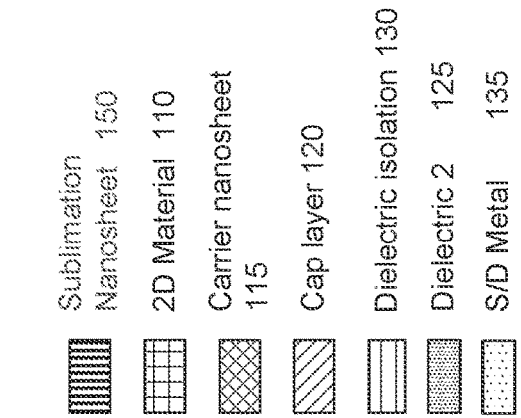

As shown in FIG. 29, a mask can be used over dielectric isolation 130 in such a way as to expose the sidewall of the carrier nanosheet 115 region and sublimation nanosheet 150 region. As the carrier nanosheets 115 support one or more layers of 2D material 110 on respective top and bottom surfaces, in order to form transistor 2D channels 250, removing sublimation nanosheets 150 can include steps that are similar, analogous or shared with those used in the removal of dielectric material 105 in connection with FIG. 8. In some embodiments, this removal process can involve forming an access trench on one or both of the sides of the channel region (e.g., the regions surrounding sublimation nanosheets 150). Such trenches are shown, for example, in FIG. 30, in which immediately abutting the sides of the transistor 100 structure are etched out trenches down to the substrate 101.

Figure 31:
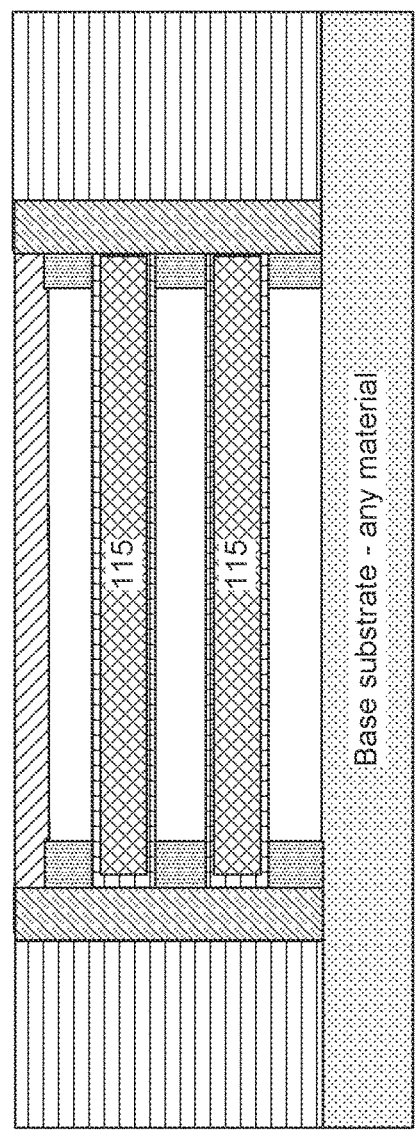

As shown in FIG. 31, sublimation nanosheet 150 can be removed through the openings in the trenches (shown in FIG. 30) by increasing the temperature to a critical temperature, Tc, for changing the state of the sublimatable material in the sublimation nanosheet 150 from solid to gas. The gas may then be evacuated by vacuum or purge to fully remove any residues. Further rinse or cleaning may also be utilized, if necessary. At the end of this step, carrier nanosheets 115 along with their 2D materials 110 can remain suspended between two S/D structures 215 and 220.

Figure 32:
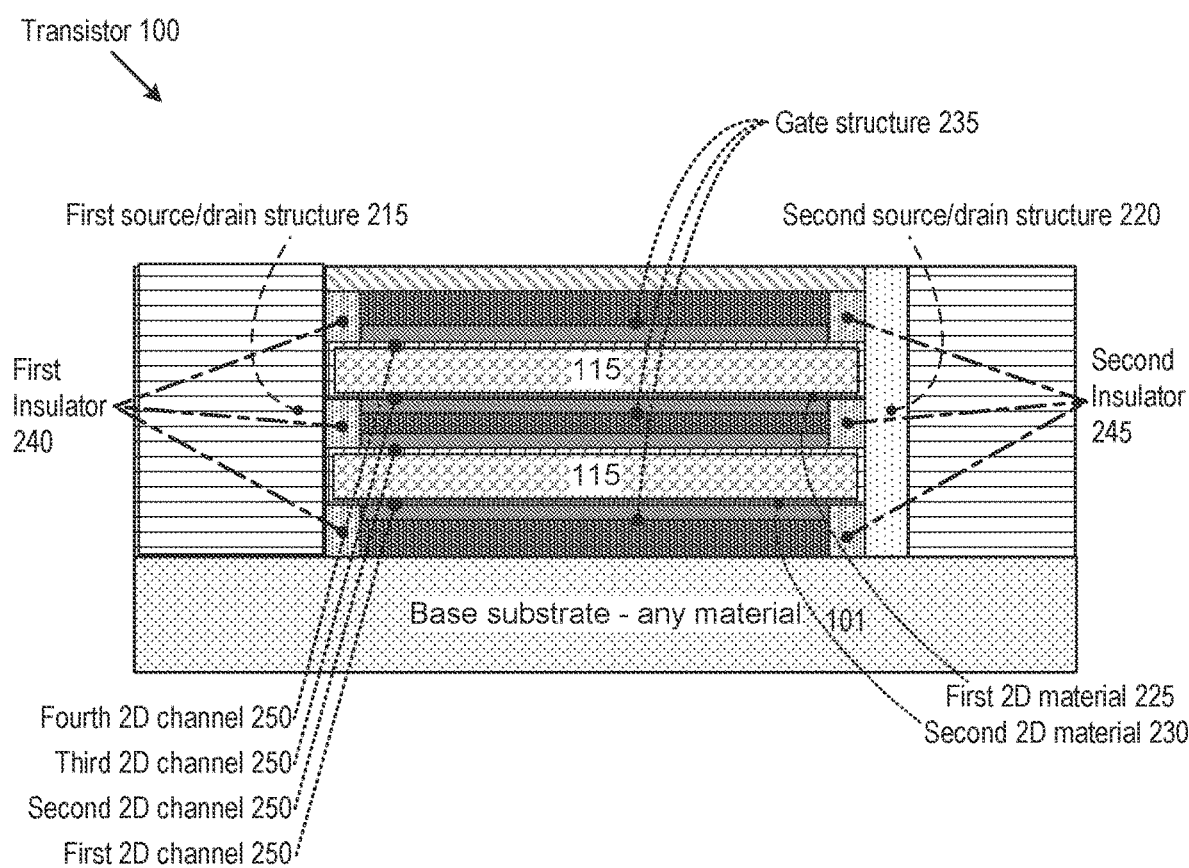

FIG. 32 illustrates a step in which a high-k gate 140 material can be selectively deposited on exposed portions of the 2D material 110 material to form a gate dielectric of the gate structure 235. A gate metal 145 can then be formed (e.g., via deposition) on exposed high-k gate 140 material to complete the gate structure 235 and the transistor 100 structure. From this point, routing of electrical lines can be provided according to conventional techniques to connect the S/D structures 215 and 220 and the gate structure 235 to a circuit of a device of which the transistor 100 is a part.

FIG. 32 also illustrates an example of a completed transistor 100 that comprises a structure that is similar to the one illustrated in FIG. 9. The transistor 100 includes two carrier nanosheets 115 disposed between first and second S/D structures 215 and 220 and having 2D material 110 layers on their lower and upper surfaces forming four 2D channels 250. Gate structure 235 can surround both of the carrier nanosheets 115 around their central regions and form GAA structure 235. The transistor 100 thereby comprises four 2D material channels 250 quadrupling the drive strength of the transistor.

FIGS. 33-47 relate to an alternative structure and method for forming a plurality of transistors 100 within a single structure in which two different types of 2D channel structures are formed using two separate sets of S/D contacts. It will be appreciated by those of ordinary skill in the art that the 2D channels 250 could include the same or a different type of channels that can be controlled with separate and independently controlled gate structures 235 and separate and independently controlled S/D structures 215 and 220. The structure can include two transistors 100, such as for example a p-type transistors 100 and an n-type transistors, or any number of combinations of both. As discussed above in connection with FIGS. 1-32, the sacrificial materials used to make the transistors 100 could be etchable, such as for example dielectric 105 in FIGS. 1-9, or sublimatable, such as sublimation nanosheet 150 in FIGS. 20-32.

Figure 33:
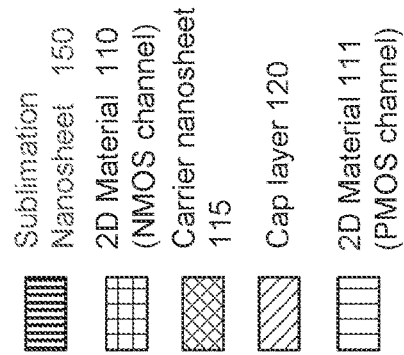
FIGS. 33-47 illustrate cross-sectional and top views of an alternative structure and method for forming a plurality of transistors in which two different 2D channel structures are formed along with two separate sets of source/drain contacts, according to one or more embodiments.
Figure 33:
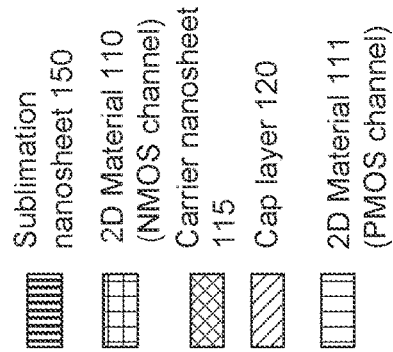
Figure 33:
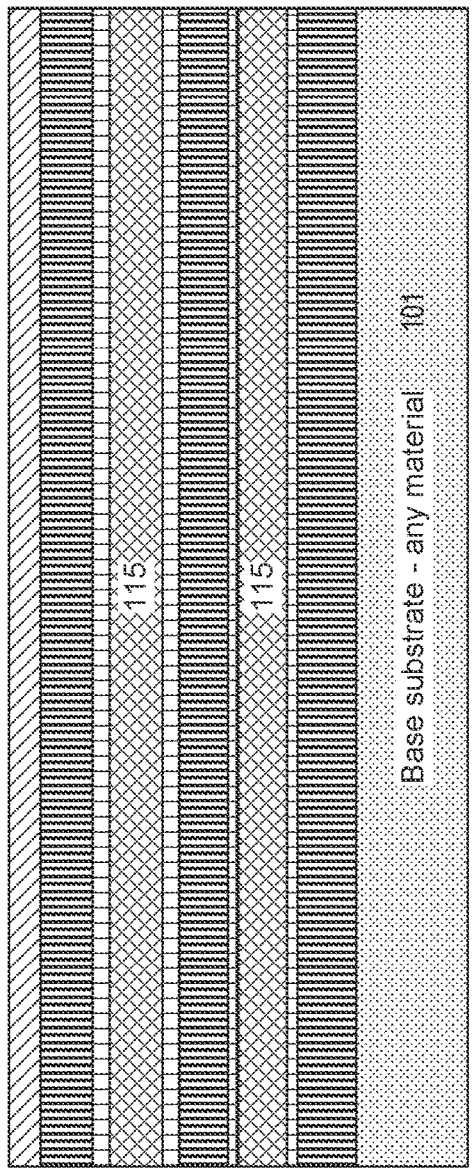

As shown in FIG. 33, a stack of materials can be formed to be same or similar to that shown in FIG. 1, or alternatively FIG. 20. The stack can include two different 2D materials, such as 110 and 111, which can be applied or coated around each of the two carrier nanosheets 115 to form different kinds of 2D channels 250. For example, transistor 100 can include an n-type 2D material 110 for an n-type transistor, and a p-type 2D material 111 for a p-type transistor 100. For example, a 2D material can include properties that make it more suitable for carrying electrons as opposed to holes, and vice versa, and may have certain band gaps or other material properties that make the 2D material more suitable for use in a PMOS or an NMOS structure, and vice versa.

FIG. 33 shows a material stack that can be the same or similar as the material stack described in connection with FIG. 20, but in this implementation, the material stack can comprise two different 2D materials 110 and 111 for forming two different types of 2D channels 250. In FIG. 33, 2D material 110 can be optimized for use in a 2D channel 250 of an n-type transistor 110 to be formed in the lower part of the structure around the first carrier nanosheet 115. The other 2D material (in the legend shown as 2D material 111) can be optimized for use in a 2D channel 250 of a p-type transistor that can formed above the n-type transistor, in the upper part of the structure, around the second carrier nanosheet 115. As indicated earlier, the carrier nanosheet 115 may be optional in some implementations and the high-k gate 140 dielectric can be used instead of the carrier nanosheet 115. The stack in FIG. 33 can also include the same or similar as material layers as in FIG. 20, except that the upper two layers of 2D material can include 2D material 111 instead of 2D material 110.

Figure 34:
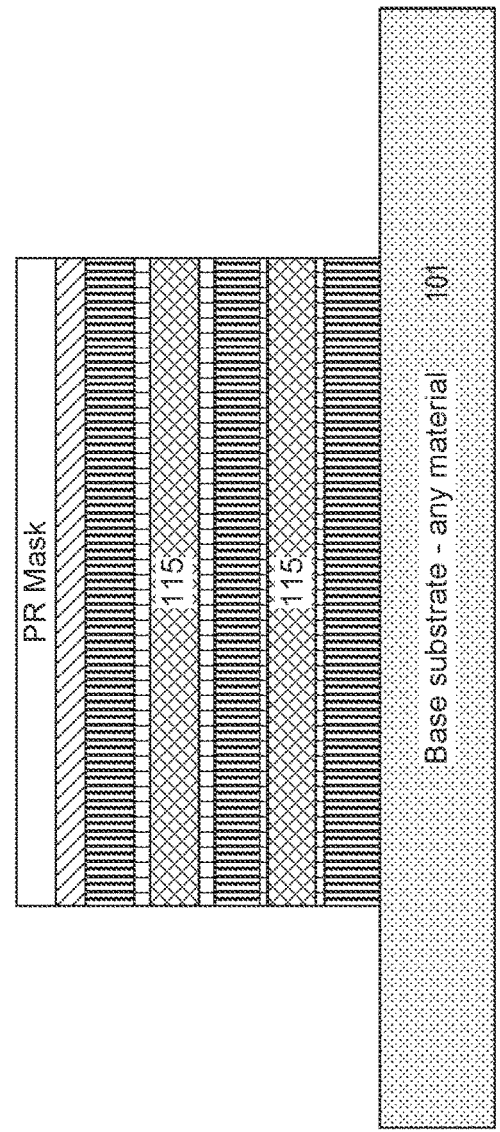

As shown in FIG. 34, mask and etch steps can be performed to generally define the transistor structures including the future S/D metal 135 regions. This may involve the same or similar steps and techniques as those used in connection with FIG. 2A.

Figure 35:
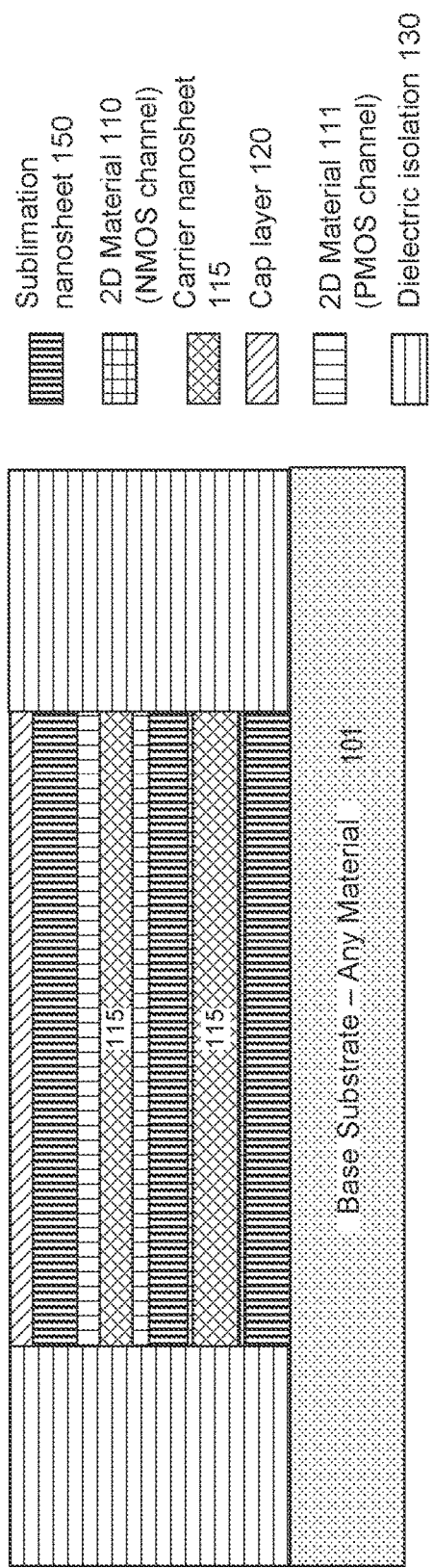

As shown in FIG. 35, a layer of dielectric 130 can be deposited and etched back using a CMP to align with the cap layer 120. Dielectric 130 can also be flushed and aligned with the 2D materials 110 and 111 on the sidewalls of the carrier nanosheets 115. In some embodiments, this can involve the same or similar steps and techniques as those discussed in connection with FIG. 2B. This can result in an isolation of the to-be-formed gate structures 235 from the to-be-formed S/D structures 215 and 220.

Figure 36:
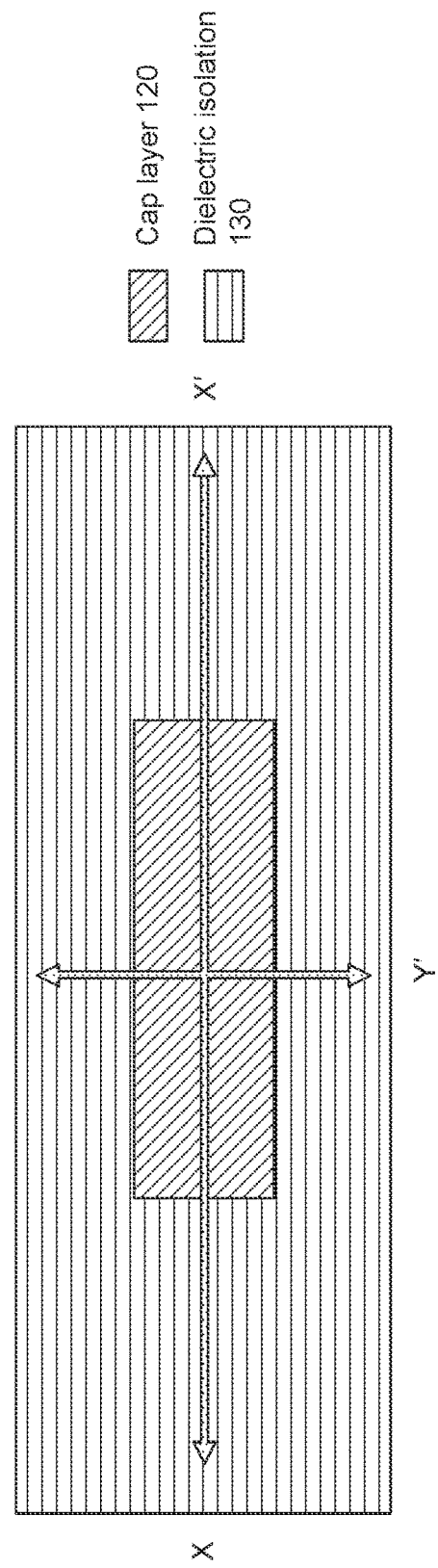
Figure 37:
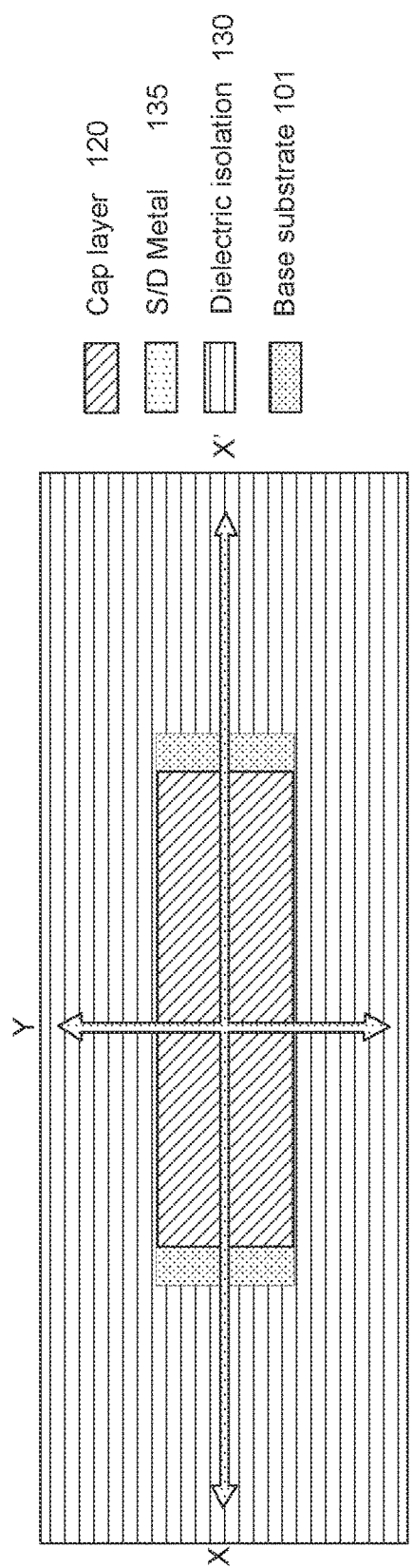

FIG. 36 shows a top view of the structure illustrating the general outline of the structure as defined by the capping layer 120. FIG. 37 shows openings being formed by masking, where the masking is not illustrated. The opening can be etched downward to form the source and drain regions for S/D structures 215 and 220. This can involve the same or similar steps or techniques as those discussed in connection with FIGS. 24-25.

Figure 38:
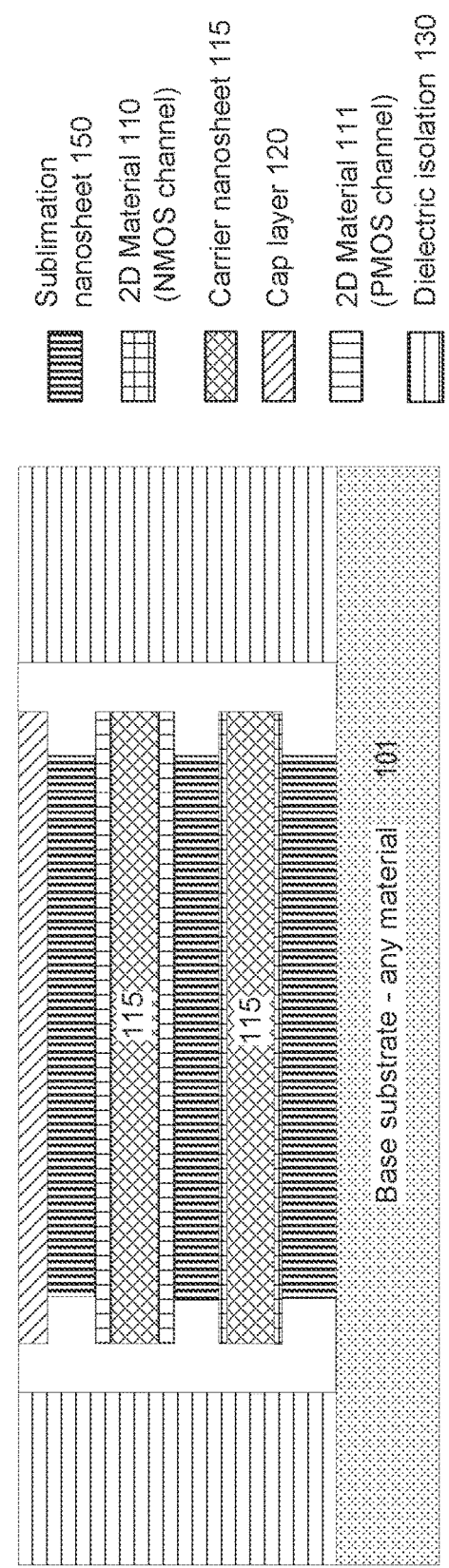

FIG. 38 shows a side view of the structure in which indent etch of the sublimation nanosheets 150 can be performed. This can involve the same or similar steps or techniques as those described in connection with FIG. 26. 2D materials 110 and 111 may optionally be formed on exposed sidewalls as shown in other techniques and steps, such as those described in connection with FIG. 3. Adding 2D materials 110 and 111 on the sidewalls can improve electrical contact with the S/D structures 215 and 220. The indented surfaces can be formed with regard to the 2D materials 110 and 111 on the sidewall portions of the carrier nanosheets 115.

Figure 39:
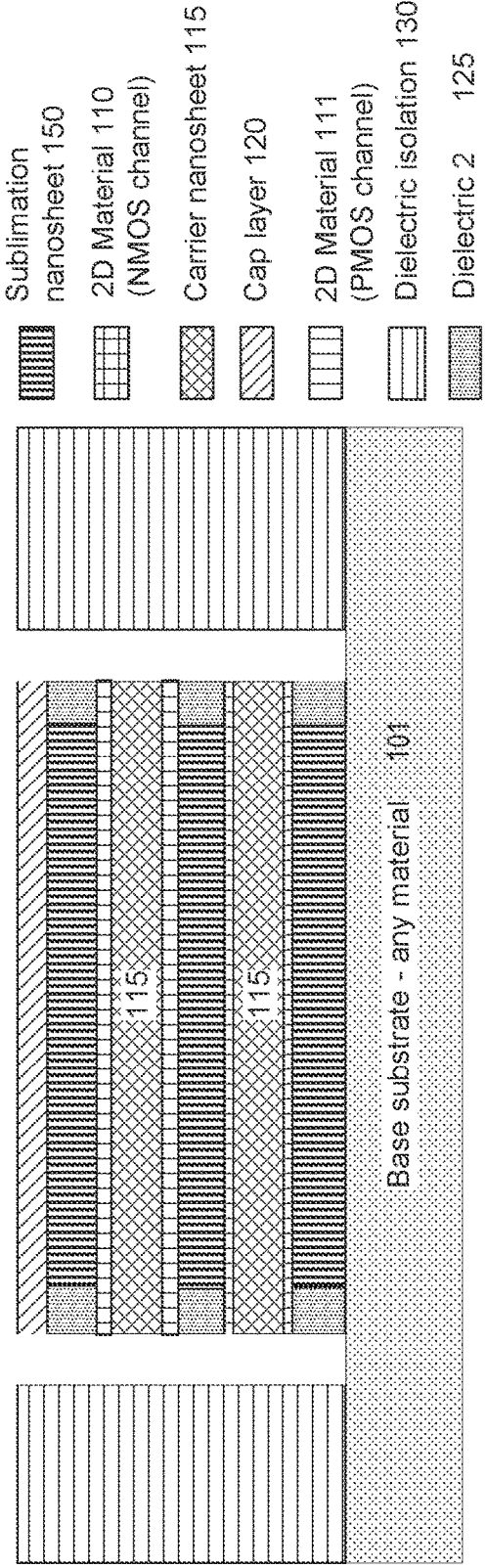

As shown in FIG. 39, a layer of dielectric material 125 can be deposited to fill in the indented areas of the sublimation nanosheets 150. Following the filling, the dielectric material 125 can be etched back using a directional downward etch (similar to the one done in connection with FIG. 5) and then a CMP can be implemented to align it with the cap layer 120 as well as with the 2D materials 110 and 111 on the sidewalls of the nanosheets. This can provide isolation of the to-be-formed gate structures 235 from the to-be-formed S/D metal 135 regions.

Figure 40:
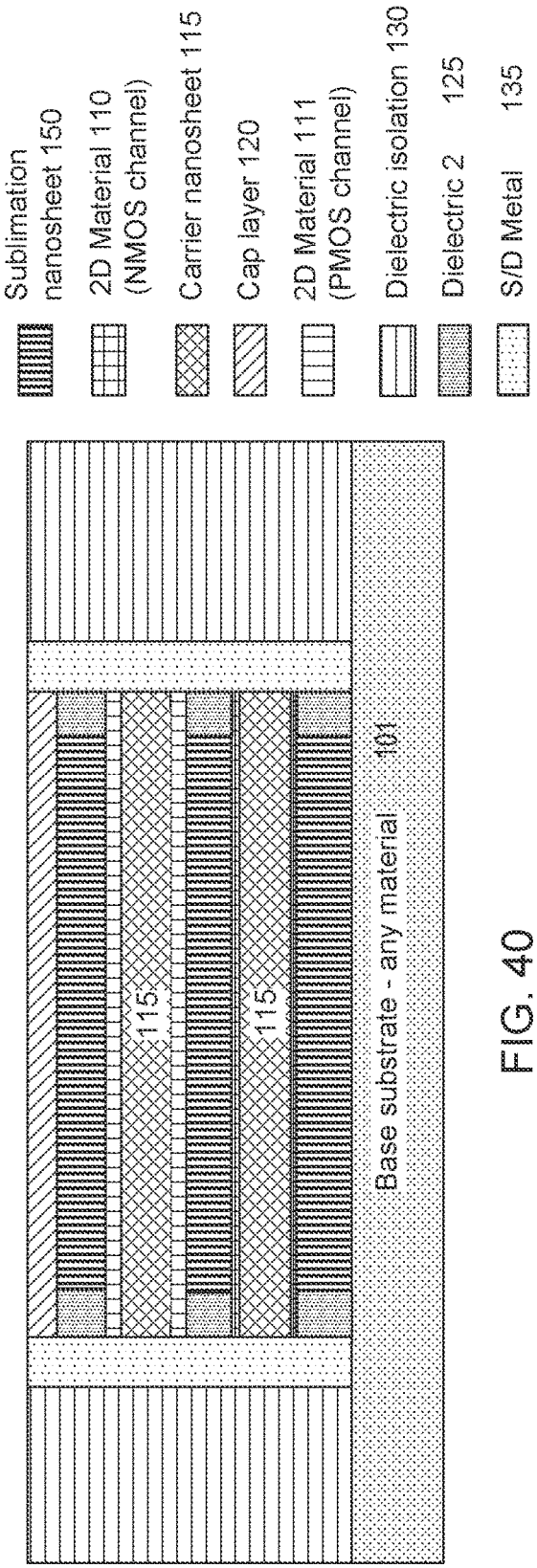

As shown in FIG. 40, first and second S/D structures 215 and 220 can be implemented by depositing S/D metal 135 into the S/D contact 135 openings in the etched out regions. This can include the same or similar steps and techniques as those discussed in connection with FIGS. 18-19.

Figure 41:
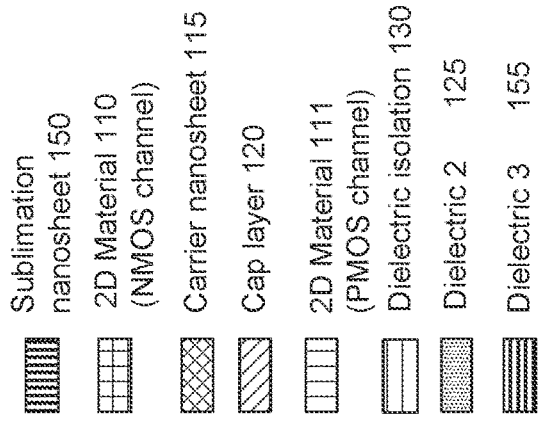
Figure 41:
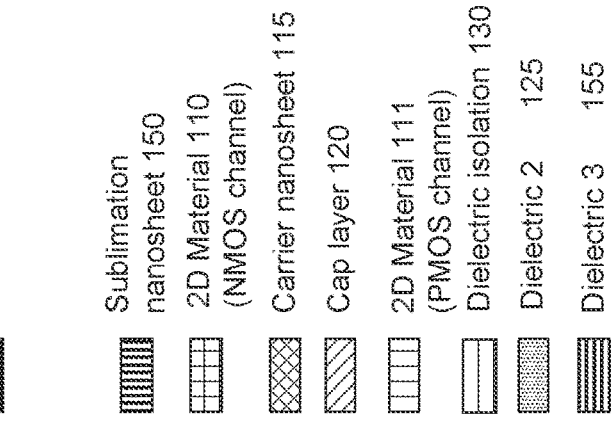
Figure 41:
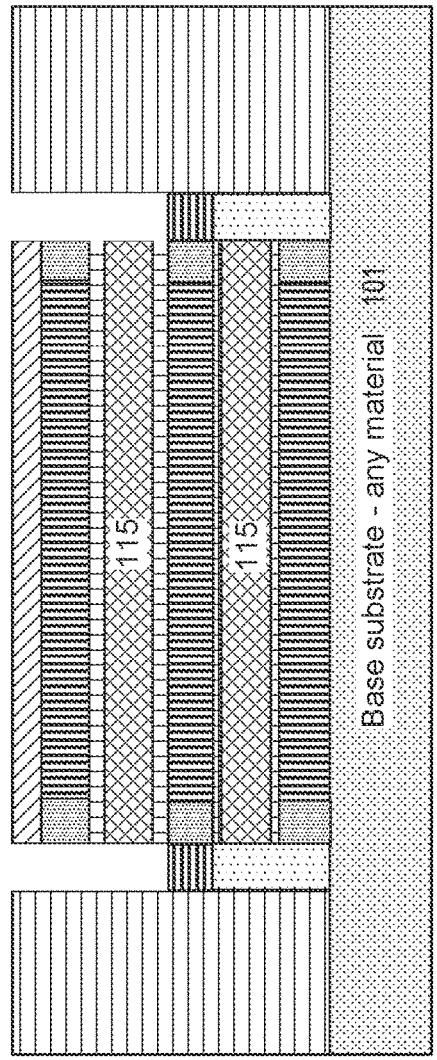

As shown in FIG. 41, portions of the S/D metal 135 that were filled into the source and drain regions etched out in connection with FIG. 39 and whose height is above the first transistor structure (e.g., above the second layer of 2D material 110 and below the second sublimation layer 150) can be removed or etched out. This can be done on source and drain contacts, as shown in FIG. 41. At the bottom of the etched out portion an electrically insulating material can be deposited, such as dielectric 155. Dielectric 155 can electrically insulate the S/D structures 215 or 220 of the lower transistor (e.g., the n-type transistor 100 formed with 2D material 110 around the first carrier nanosheet 115) from the S/D structures 215 or 220 of the upper transistor (e.g., transistor 100 formed with 2D material 111 around the second carrier nanosheet 115). This electrical insulation by dielectric 155 can enable the S/D structures 215 and 220 of the lower (e.g., n-type) transistor to be independently controlled from the S/D structures 215 and 220 of the upper transistor (e.g., p-type).

Figure 42:
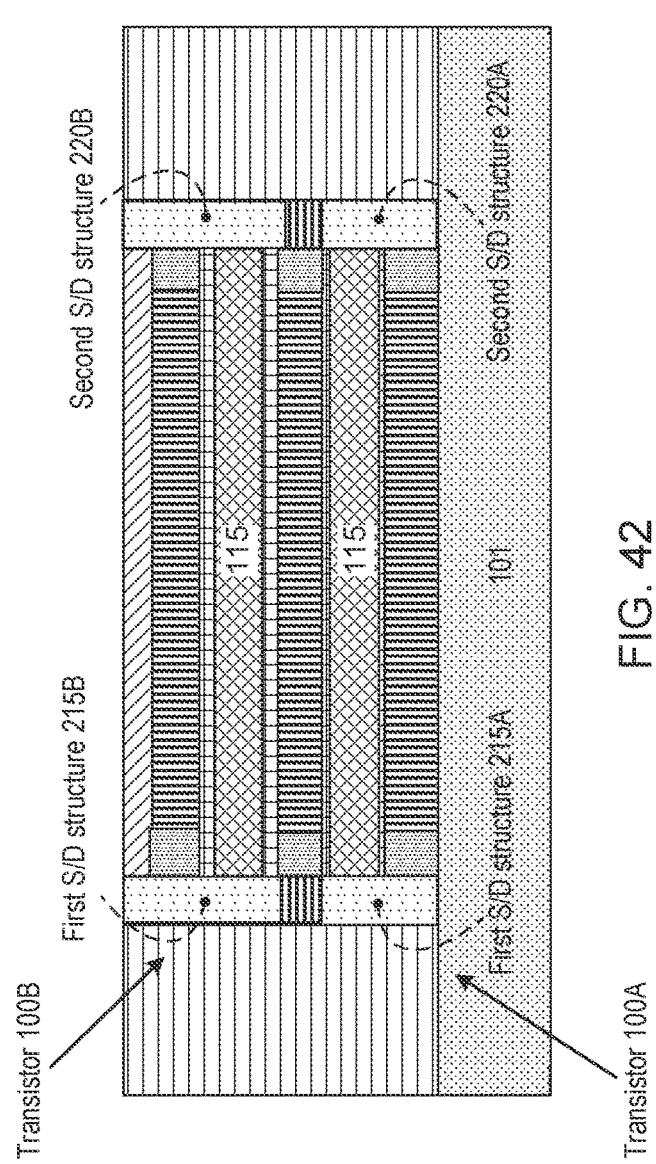

As shown in FIG. 42, following the steps in FIGS. 33-42 two separate sets of S/D structures can be formed for two separate transistors to be completed: the first and second S/D structures 215A and 220A for the transistor 100A to be completed at the lower part of the structure and the first and second S/D structures 215B and 220B for the transistor 100B to be completed at the upper end of the structure. Once an electrical insulation is provided by dielectric 155 between the S/D structures 215A and 220A of the lower level transistor 100A and S/D structures 215B and 220B of the upper level transistor 100B, S/D metal 135 can be added back into the etched out area to form the top level S/D structures 215B and 220B for the top level transistor 100B. The S/D structures 215 and for each transistor structure (e.g., the lower and upper) can include unique materials and can be optimized for the type of transistor required, or can use the same materials.

Figure 43:
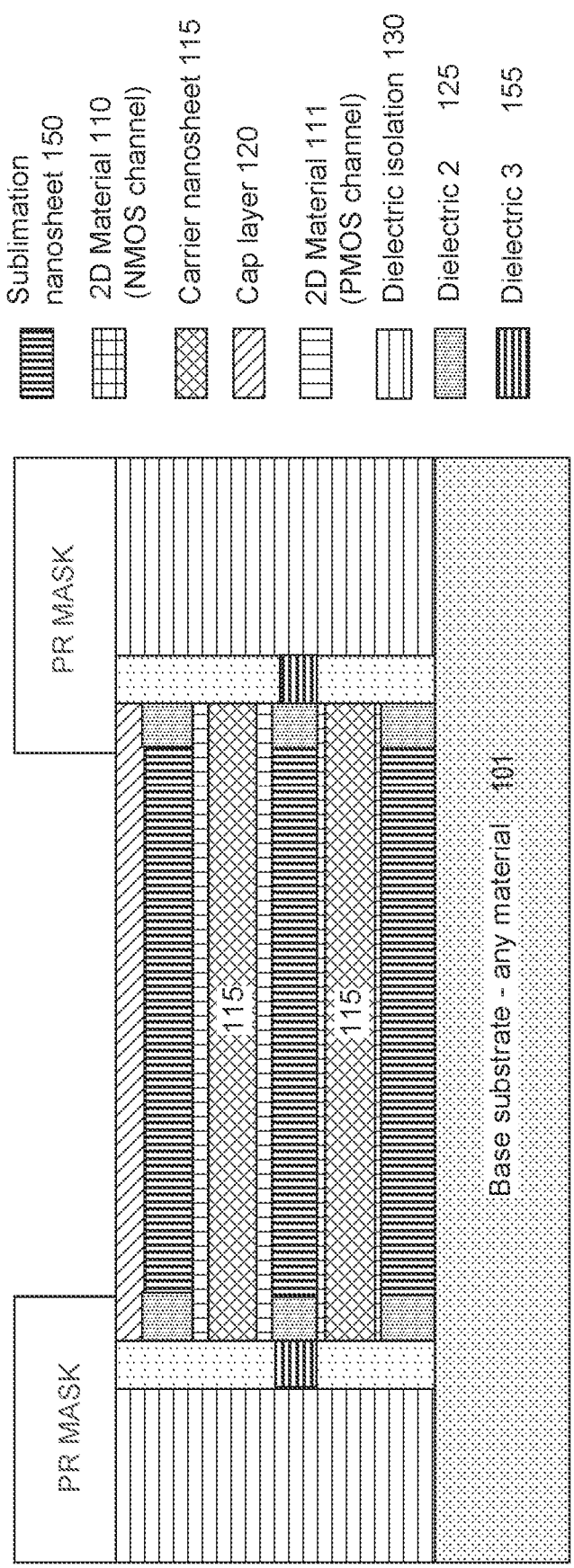
Figure 44:
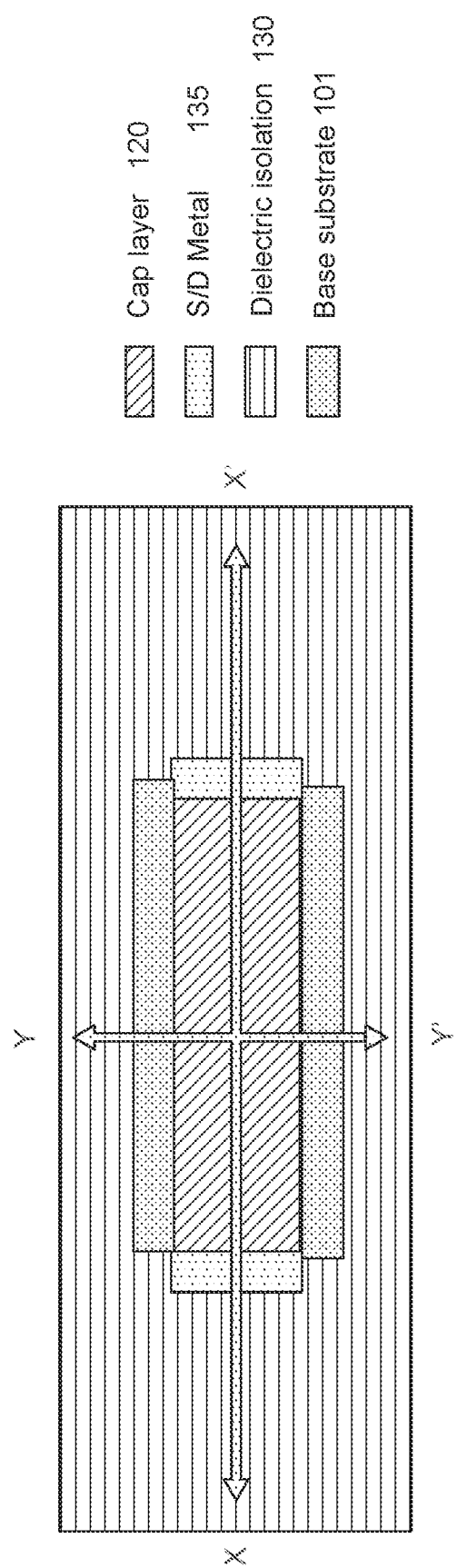
Figure 45:
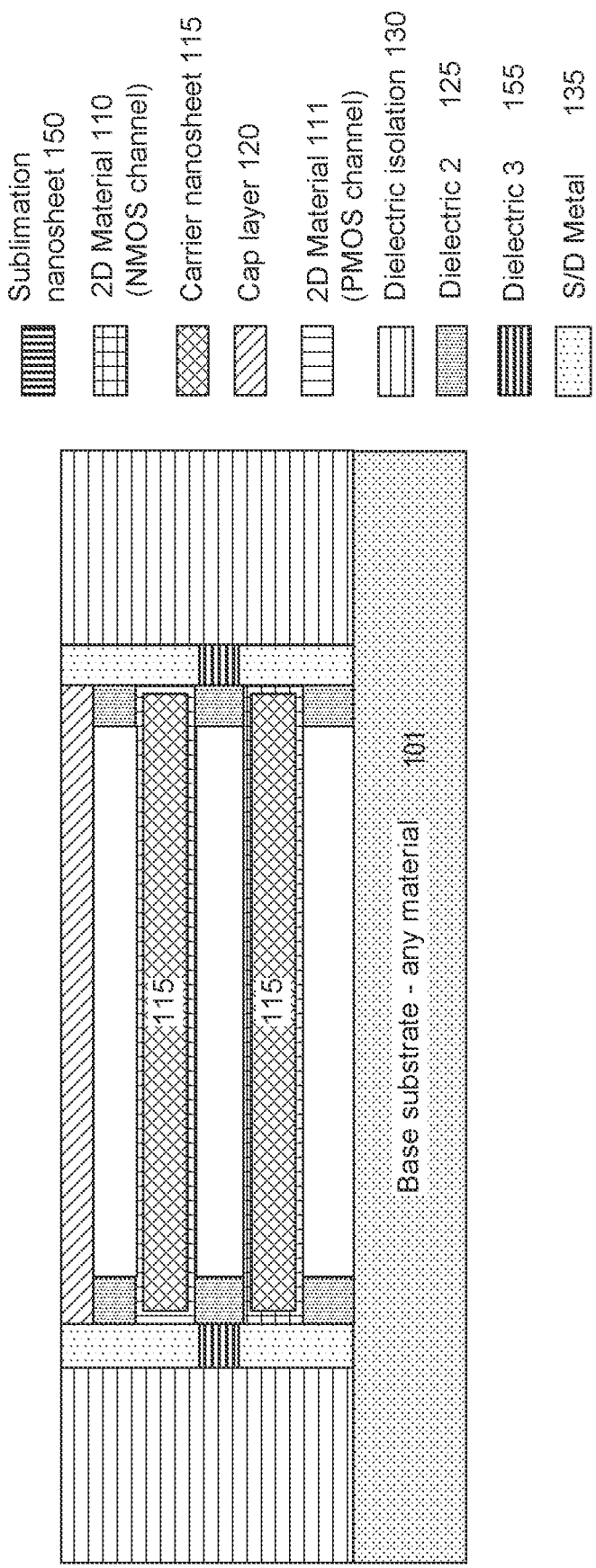

As shown in FIGS. 43, 44, and 45, mask and etch steps can be used to create a trench or opening in the isolation dielectric adjacent the transistor structure in order to expose sidewalls of the carrier nanosheets 115. This can be done on one side of the structure or on both sides of the structures along the length of the structure, as shown for example in the top view on FIG. 44. This can be implemented using the same or similar techniques or steps as those implemented in connection with FIGS. 29-31.

As shown in FIG. 45, the temperature of the structure can be increased to Tc (e.g., a temperature high enough to sublimate the sublimation nanosheets 150) in order to sublimate the sublimatable material from the sublimation nanosheets 150 leaving the carrier nanosheets 115 with 2D materials 110 and 111 intact. Alternatively, if the sacrificial layer is an etchable material, such as the dielectric 105 in FIGS. 1-9, the opening can provide the access for etching that material. Otherwise, the opening provides access for the sublimated gas to be removed.

Figure 46:
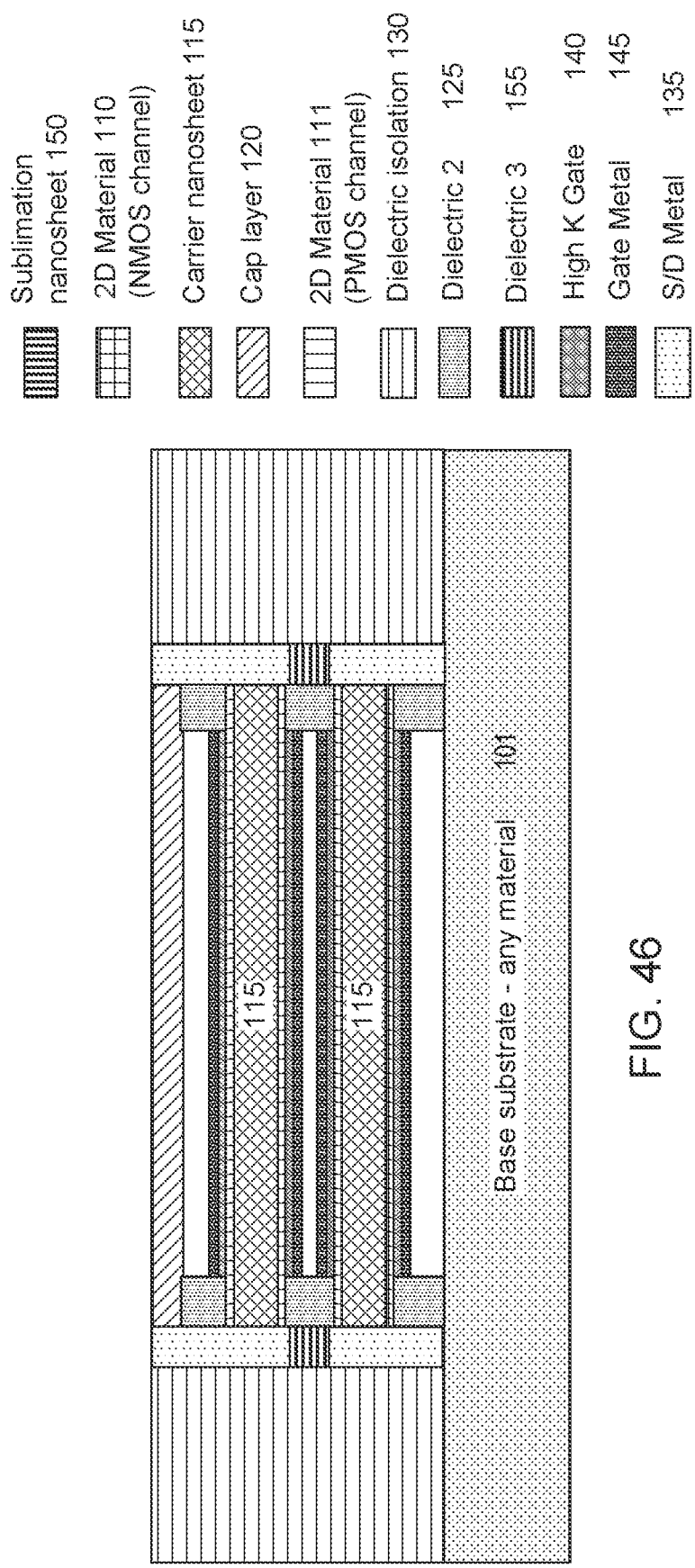

FIG. 46 illustrates a step in which a high-k 140 material can be selectively deposited on exposed portions of the 2D conductive materials 110 and 111 to form one or more gate high-k 140 dielectric layers of the gate structure 235. A gate metal 145 can then be formed on exposed gate high-k 140 dielectric so as to complete the gate structure 235 and the transistors 100A and 100B.

Figure 47:
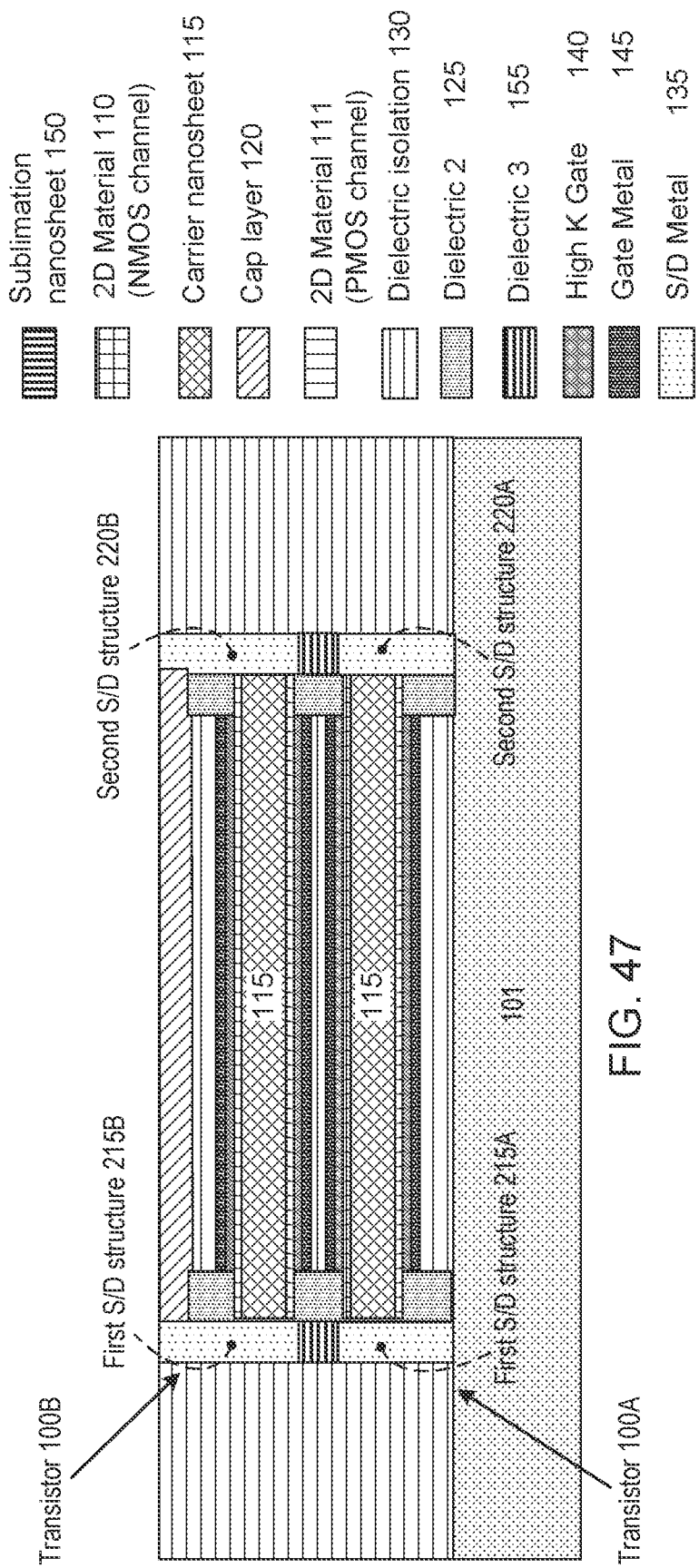
Figure 48:
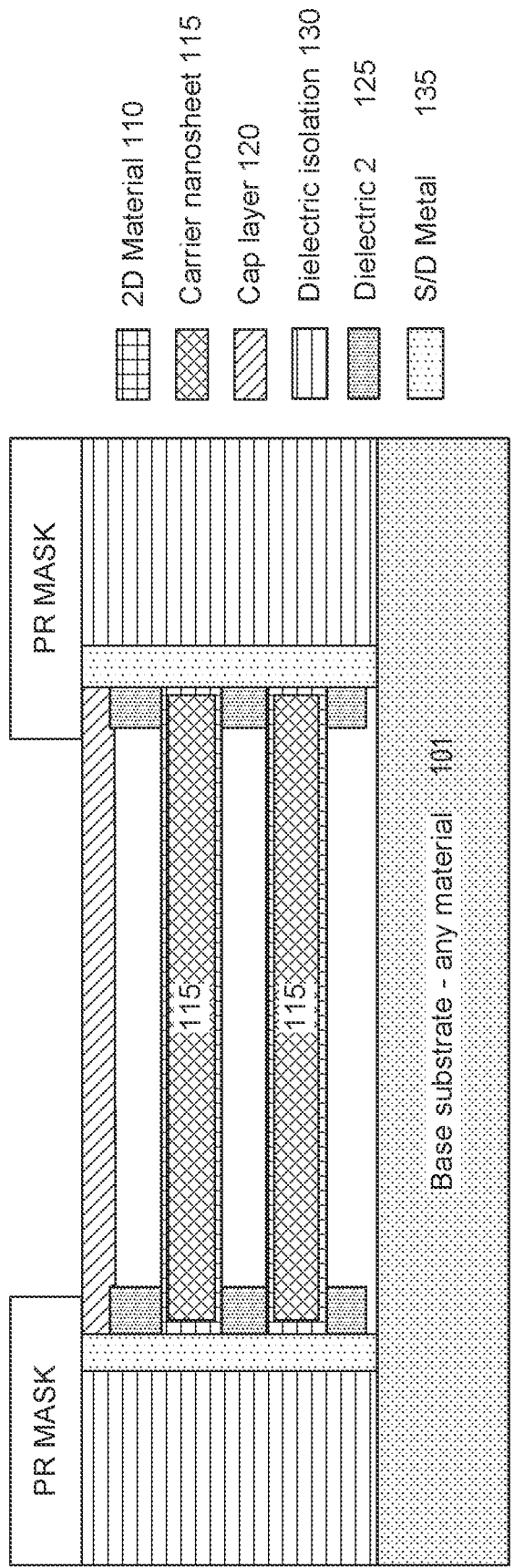
FIGS. 48-51 illustrate cross-sectional views of an example structure and process flow to implement gate-all-around ("GAA") implementations of 3D transistors in which 2D material channels are surrounded by gate materials on all sides, according to one or more embodiments.

In FIG. 47, a dielectric isolation 130 can be deposited to isolate the gate structure 235 and other features of the transistors 100A and 100B from the different transistor structures or surrounding elements. After dielectric isolation 130 is filled, a CMP can be performed.

The resulting structure in FIG. 47 can therefore include a lower n-type transistor 100A whose 2D channels 250 are formed with 2D material 110 around first carrier nanosheet 115 and whose S/D structures 215A and 220A provide source and drain contacts for transistor 110A. The structure can also include an upper p-type transistor 100B formed with 2D material 111 around the second carrier nanosheet 115 and whose S/D structures 215B and 220B provide source drain contracts for transistor 100B. The structure can include one or more gate structures 235, which can, depending on the implementation, control the transistors 100A and 100B independently or together. For example, a single gate structure 235, including high-k gate 140 dielectric and gate metal 145 can surround 2D channels 250 of both transistors 100A and 100B, thus controlling the transistors 100A and 100B simultaneously. In some implementations, a first gate structure 235 can be formed around transistor 100A and a second gate structure 235, whose gate metal 145 is electrically insulated from that of the first gate structure 235, can be formed around transistor 100B, thus each gate structure 235 controlling transistors 100A and 100B independently.

Routing can then be provided according to conventional techniques to connect the source, gate and drain of each of the two transistors (e.g., upper and lower) to a circuit or a device of which these transistors can be a part.

FIGS. 48-51 further illustrate GAA implementations in which 2D material can be formed on multiple or all sides of the carrier nanosheets 115. Utilizing the process steps and techniques that can be similar to those discussed for example in connection with FIG. 8, 15, or 31, mask and etch isolation to expose sidewall of the carrier nanosheets 115 can be implemented. Dielectric 105 or the sublimation nanosheet 150 layers can then be removed to leave the carrier nanosheets 115 with 2D materials 110 and/or 111 exposed inside the structure. Following these steps, GAA coverage can be implemented to form a gate structure 235 partially or entirely surrounding 2D material 110 and 111 layers. GAA coverage can include surrounding the 2D materials 110 and 111 on the carrier nanosheets 115 from all sides, including from the carrier nanosheet 115 bottom surface, a first side surface, the top surface, and the second (e.g., opposite) side surface of the carrier nanosheet 115. This GAA coverage can be implemented using the process steps and techniques described, for example, in FIG. 17, 32, or 46.

Figure 49:
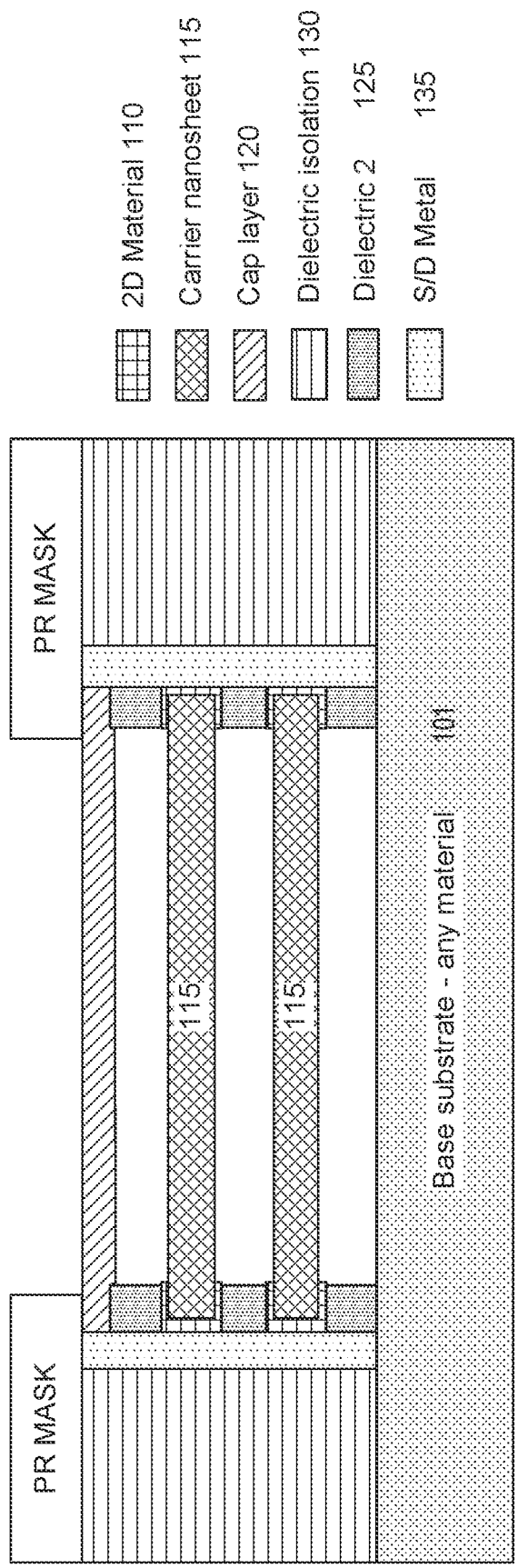

In FIG. 49, 2D materials 110 or 111 can be removed from the contemplated future 2D channel 250 region(s). This removal process can be done, for example, in any of the prior steps, such as when all materials are not covered by the PR mask or dielectric 125, selective to cap layer 120, and carrier nanosheet 115. At this step 2D materials 110 (or 111 where applicable) that are exposed can be removed.

Figure 50:
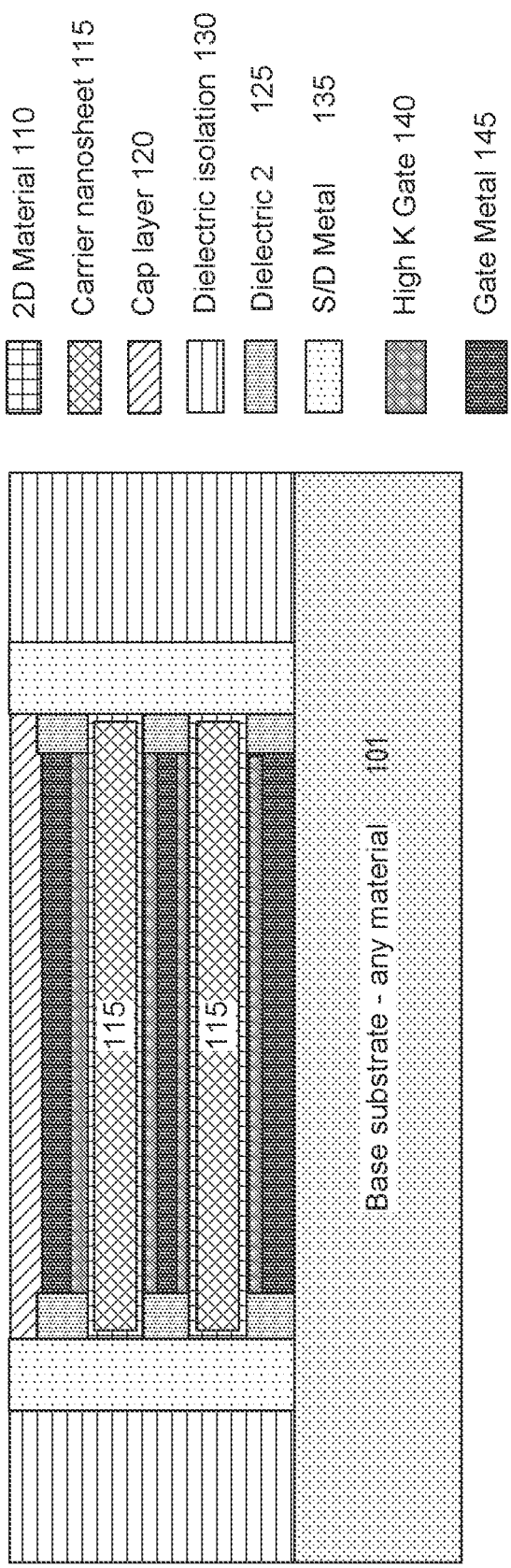

In FIG. 50, PR mask removal can be followed by forming 2D channel 250 by reapplying material 110 or 111 on the carrier nanosheet 115. As 2D deposition is a self-limiting process, all four sides of the GAA deposition of the 2D material (whether 110 or 111) can have the same thickness if started with either steps or techniques discussed in connection with for example FIG. 31 or 42.

Figure 51:
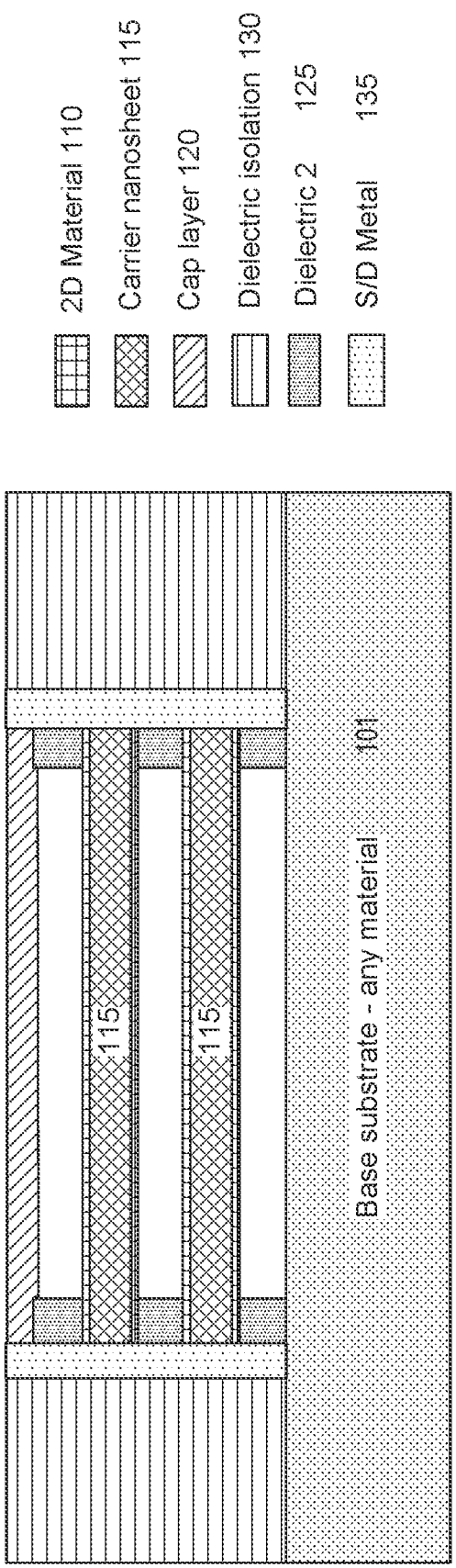

In FIG. 51, process steps and techniques similar to those discussed earlier in connection with FIGS. 8-31 can be implemented. PR mask can be removed and dielectric 105 layers (or alternatively the sublimation nanosheets 150) can be removed using aforementioned techniques, leaving carrier nanosheets 115 isolated. In some embodiments, S/D metal 135 over the first channel nanosheet 115 can be removed and an isolation dielectric 155 can be inserted, followed by a refilling of the S/D metal 135 to complete the S/D structures 215 and 220 for the upper and lower transistors 100. This can result in two different transistors 100, similar to the structure discussed in connection with FIG. 47, for example.

Figure 52:
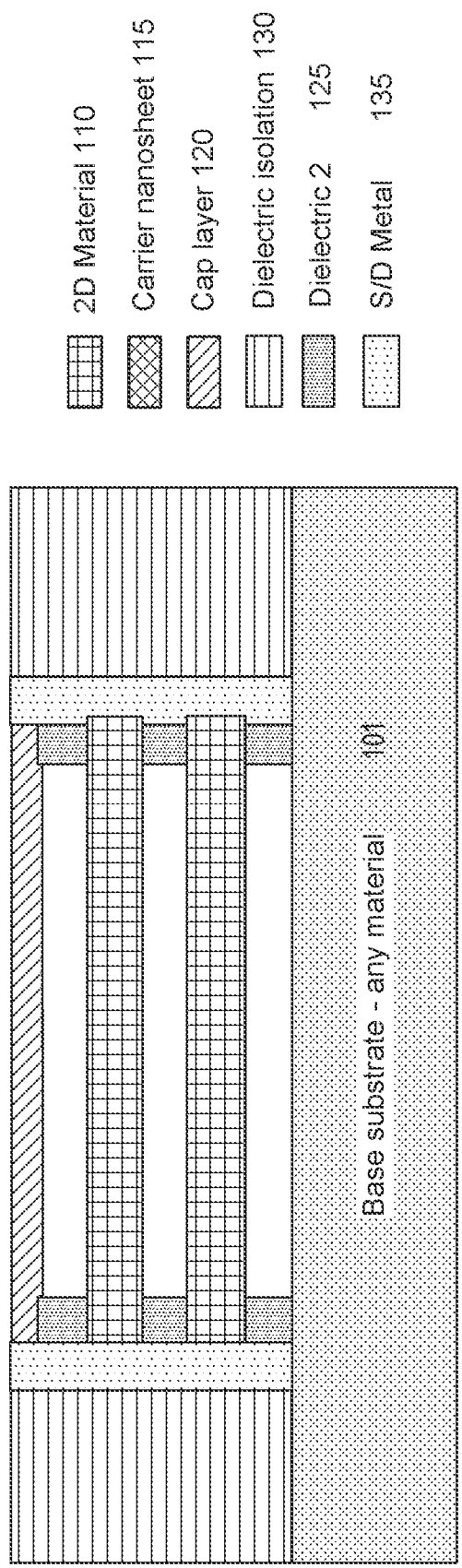
FIGS. 52-53 illustrate cross-sectional, and perspective views of an alternative example structure and process flow to 3D transistors with 2D channel structures formed on all exposed surfaces of the carrier nanosheet, according to one or more embodiments.

In FIG. 52, an embodiment is illustrated in which instead of deposition in FIG. 50, a selective deposition of 2D material 110 or 111 can be used to cover the vertical side regions of the carrier nanosheets 115. Once this is completed, a 360 degree GAA structure surrounding the 2D material 110 or 111 can be formed. This GAA structure can result in increased 2D channel 250 areas because the carreer nanosheets 115 can have 2D channels 250 on the bottom surface, the top surface and the vertical side surfaces of the carrier nanosheet 115, thus resulting in an improved and increased 2D channel 250 drive strength.

Figure 53:
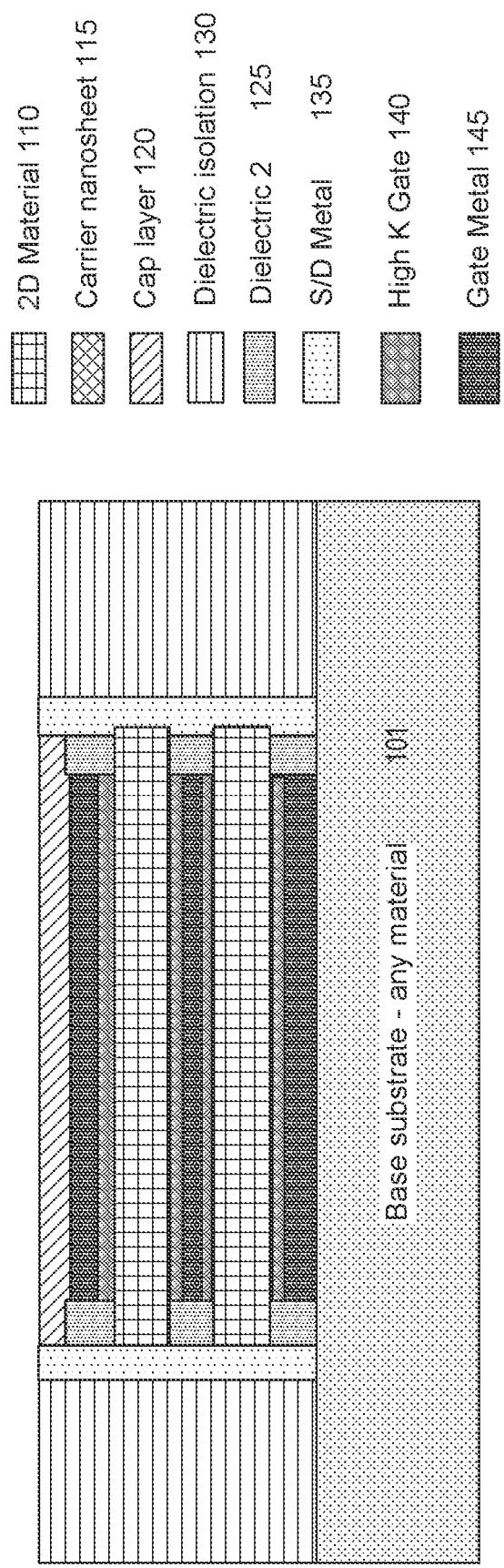

In FIG. 53, GAA structure of 360 degrees around the 2D channels 250 can be completed by applying or otherwise selectively depositing high-k 140 material on top of the 2D material 110 (or 111 where applicable). Because 2D material 110 (or 111) in this implementation covers all exposed surfaces of carrier nanosheets 115 between the S/D structures 215 and 220 at the distal ends of the career nanosheets 115 (including the top, bottom and both vertical side surfaces), high-k gate 140 material can cover all surfaces of the carrier nanosheet 115 not covered by the dielectric 125 or S/D metal 135. Gate metal 145 can be applied or selectively deposited on gate high-k 140 material, thus completing the 360 degree GAA gate structure 235.

Figure 54:
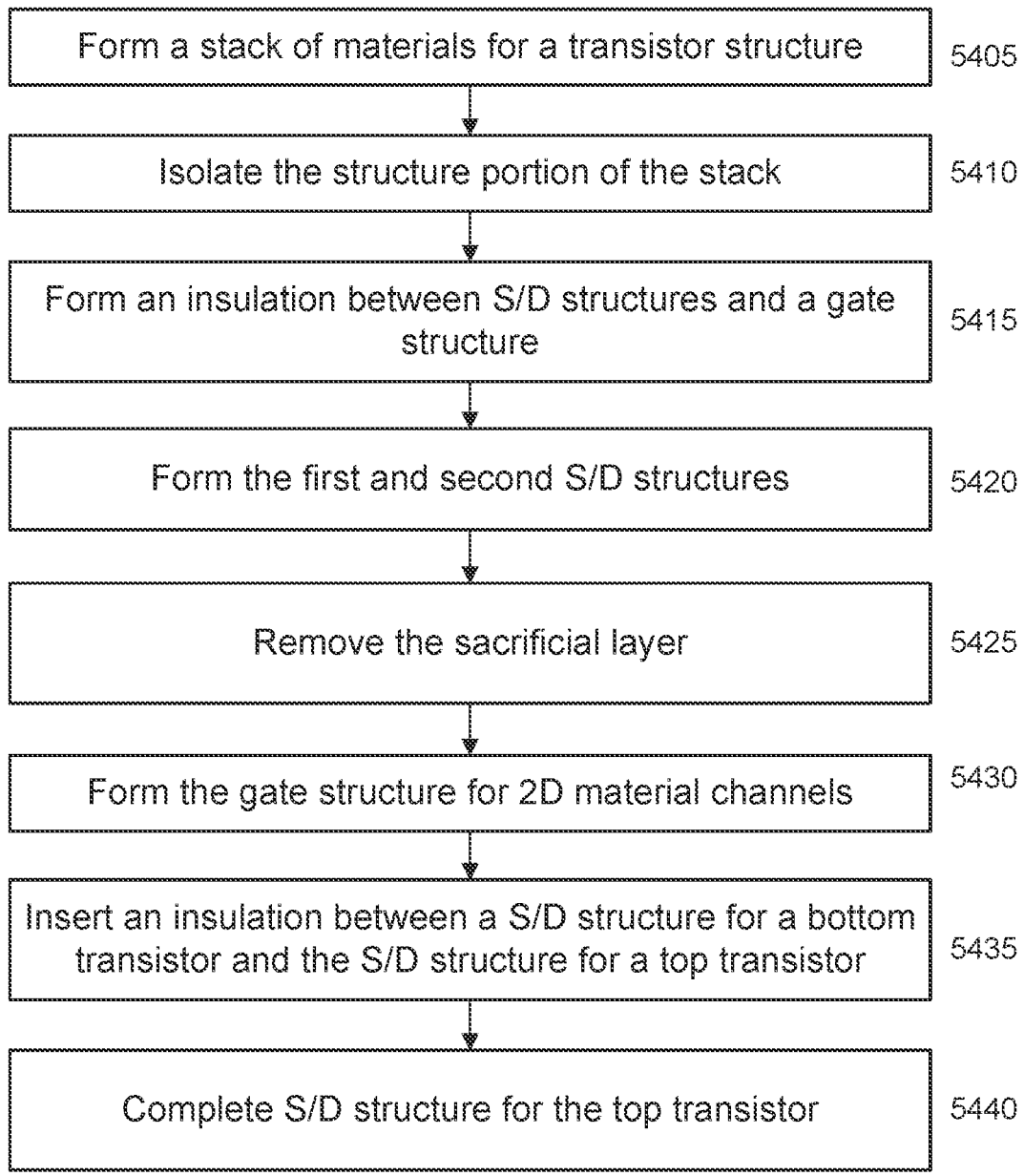
FIG. 54 is a flow diagrams of example methods for fabricating 3D transistors with 2D channel structures using the process flows described in connection with FIGS. 1-53, according to one or more embodiments.

Referring now to FIG. 54, illustrated is a flow diagram of an example method 5400 for fabricating one or more transistors 100 using a 3D structure with 2D materials techniques shown and discussed in connection with FIGS. 1-53. In some aspects, the method 5400 relates to process steps for fabricating a single transistor 100 having one or more 2D material channels 250. In some aspects, the method 5400 relates to fabricating two or more 3D transistors utilizing 2D material channels 250 that are stacked on top of each other.

The method 5400 of FIG. 54 can include a series of steps from 5405 to 5445. Step 5405 can include forming a stack of materials for a transistor structure. Step 5410 can include isolating the structure portion of the stack. Step 5415 can include forming an insulation between source/drain structures and a gate structure. Step 5420 can include forming the first and second source/drain structures. Step 5425 can include removing the sacrificial layer. Step 5430 can include forming a gate structure for the 2D material channels. Step 5435 can include inserting an insulation between a S/D structure for a bottom transistor and an S/D structure for a top transistor. Step 5440 can include completing the structure for the top transistor.

Step 5405 can include forming a stack of materials for fabricating one or more transistors. The stack can include a plurality of layers of materials stacked one on top of another. The material stack can be formed on a substrate, which can include a semiconductor substrate or any other material substrate, including for example glass, ceramic, metal, a plastic, a flexible substrate or any other substrate discussed herein or used in the industry. The stack can include a layer of sacrificial material that can be removed during the process. The sacrificial material layer can include a dielectric material, such as a dielectric 105, or a sublimation material, such as sublimation nanosheet 150. Alternative sacrificial material layers may be utilized.

The material stack can include a first layer of material deposited or applied on a substrate 101. The first layer of material can include a sacrificial layer of material to be removed later during the process, such as a dielectric 105 or sublimation nanosheet 150. On top of the first layer of 2D material, which can include a first layer of 2D material 110 or 111. On top of the first layer of 2D material can be a first carrier nanosheet (e.g., carrier nanosheet 115), on top of which can be a second layer of 2D material, on top of which can be a second layer of sacrificial material (e.g., dielectric 105 or sublimation nanosheet 150), on top of which can be a third layer of 2D material, on top of which can be a second carrier nanosheet 115, on top of which can be a fourth layer of 2D material, on top of which can be a third layer of sacrificial material, on top of which can be a cap layer 120. All layers of 2D material can include a monolayer of atoms or molecules and so 2D material layers can be thinner than remaining layers in the stack.

Material stack can for example include a stack of material layers, such as the one described in connection with FIG. 1. Material stack can include a stack of material layers, such as the one described in connection with FIG. 10. Material stack can include a stack of material layers, such as the one described in connection with FIG. 20. Material stack can include a stack of material layers, such as the one described in connection with FIG. 33. In the event that two transistors are contemplated, one on top of another, the first and second 2D material layers can be different from the third and fourth 2D material layers. For example, the first and second 2D material layers can include 2D material 110 that can be more suitable for n-type transistors, whereas the third and fourth 2D material layers can include 2D material 111 that can be more suitable for p-type transistors, or vice versa.

Step 5410 can include isolating the structure portion of the stack. A PR mask can be used to cover the portion of the material stack in which one or more transistors 100 can be fabricated, allowing for an etch of the areas that surround the material stack dedicated for the one or more transistors 100. The etched out area can then be filled with isolation dielectric, such as dielectric 130. Techniques and process steps used in this method step can include, for example, techniques discussed in connection with FIGS. 2A-2B, 11, 21-22, and 34-35.

Step 5415 can include forming an insulation between one or more source/drain structures or contacts 215 and 220 and a gate structure 235. The insulation formed can be an electrical insulation that can be implemented by depositing a layer of electrically insulating dielectric between the gate structure 235 and the S/D structures 215 and 220. This can be accomplished, for example, using indent etch to remove a portion of a sacrificial layer (e.g., dielectric 105 or sublimation nanosheet 150) from around the outer edges of the structure and deposit electrically insulating dielectric in the indent etched out regions. For example, this can be implemented using techniques and steps discussed in connection with FIGS. 3-5, or FIGS. 37-39 in which a downward etch is first made between the sides of the material stack and the surrounding dielectric isolation 130, followed by an indent etch of the outer portions of the sacrificial layers (e.g., dielectric 105 or sublimation nanosheet 150), and then dielectric 125 is deposited into the etched areas to fill them with the insulator (e.g., dielectric 125). Following this step, a directional etch can be completed downward to etch out the dielectric 125 from the regions in which S/D structures 215 and 220 are to be formed.

Electrical insulation between S/D structures and the gate structure can also be formed for example using techniques and steps discussed in connection with FIGS. 15-16 in which PR mask is applied to protect the surrounding dielectric isolation 130 after which sacrificial material layers can be removed by either an isolated etch the dielectric 105 or thermal removal of the sublimation nanosheet 150. Once the sacrificial material is removed, dielectric 125 can be selectively deposited on the interior surfaces of the previously deposited S/D metal 135. Dielectric 125 can therefore be deposited on the sidewall of the S/D structures 215 and 220 and extend towards the interior in which the gate structure 235 is to be formed.

Step 5420 can include forming the first and second source/drain 215 and 220 structures. The first and second source/drain structures 215 and 220 can serve as the source and drain contacts of the transistor 100. In some implementations, S/D structure 215 can be a source and the S/D structure 220 can be a drain of the transistor 100. In some implementations, S/D structure 215 can be a drain and S/D structure 220 can be the source of the transistor 100. S/D structures 215 and 220 can be formed using material or any other electrically conductive material, such as S/D metal 135. In some embodiments, a first source/drain structure 215 can formed using a material that is different than the material used in second source/drain structure 220.

S/D structures 215 and 220 can be formed for example using the techniques, such as those discussed in connection with FIGS. 5-6 in which a trench on the sides of the layer stack is etched directionally downward, and where S/D structures 215 and 220 can be formed after dielectric insulation 125 is applied to insulate the S/D structures 215 and 220 from the gate structure 235. S/D structures 215 and 220 can be formed using S/D metal 135 filling so as to create an electrical contact between the S/D metal 135 and the 2D material 110 or 111.

S/D structures 215 and 220 can also be formed using techniques discussed, for example in FIGS. 12-13 and FIGS. 18-19, where in the steps discussed in connection with FIGS. 12-13 S/D metal 135 is deposited onto the sides of the structure and into the indent etched out areas of the dielectric 105 sacrificial layer. After that, as described in connection with FIGS. 18-19, a PR mask can be applied to protect the dielectric isolation 130 and remainder of the S/D metal 135 can be deposited to fill in the trench and make the contact with the S/D metal 135 applied in connection with FIGS. 18-19.

In some embodiments, multiple transistors 100 (e.g., 100A and 100B) can be formed in a structure and each transistor can have its own set of S/D structures 215 and 220 that are electrically insulated from other S/D structures 215 and 220 of other transistors 100. S/D structures 215 and 220 can be formed so that each one set of S/D structures 215 and 220 operate only with a single transistor 100. For example, two transistors can be fabricated using steps described in connection with FIGS. 33-47. As shown in FIGS. 40-42, an S/D material 135 filling can be used to fill the etched out trench on the distal ends of the layer stack so as to form an electrical contact with 2D materials 110 and 111. Following the S/D metal 135 deposition, an upper portion of the S/D material 135 (e.g., the portion above the bottom transistor) can be etched out up to the height of about the mid-point of the second sacrificial layer (e.g., the second dielectric 105 layer or the second sublimation nanosheet 150). Once this partial etch of the top portion of the S/D metal 135 is completed, an insulator dielectric 155 can be applied on top of the remaining S/D metal 135 (e.g., of the bottom transistor) so as to electrically insulate the lower S/D structures 215 and 220 from the upper S/D structures 215 and 220, to be formed. Once dielectric 155 is applied, the S/D material 135 can fill the top portion of the trench (e.g., on top of the dielectric 155 layer) thereby completing the S/D structures 215 and 220 for the upper transistor. By completing this step, S/D structures 215 and 220 for the lower transistor 100 can be electrically insulated from the S/D structures 215 and 220 of the upper transistor 100. At the same time, S/D structures of the lower transistor can form an electrical contact with the 2D materials around the first carrier nanosheet 115 (e.g., to form 2D channels 250 of the lower transistor), while the S/D structures of the upper transistor can form an electrical contact with the 2D materials on the second carrier nanosheet 115 (e.g., to form 2D channels 250 for the upper transistor).

Step 5425 can include removing the sacrificial layers from the structure. Removing sacrificial layer can include, for example, removing dielectric 105, such as described in connection with FIGS. 8 and 15 in which dielectric 105 can be selectively etched out, leaving 2D material 110 (or 111) exposed. Likewise, removing sacrificial layer can include removal of sublimation nanosheet 150, which can be accomplished by heating the structure above the temperature at which the sublimation nanosheet 150 sublimates and turns to gas, allowing the material to be pumped out. This can be accomplished, for example, using steps and techniques described in connection with FIGS. 30-31 and 40-45.

In some implementations, access trenches can be created beside the structure to enable the removal of the sacrificial layer. This can be implemented for example using techniques and steps discussed in connection with FIG. 30

Step 5430 can include forming a gate structure 235 for the 2D material channels 250. The gate structure 235 can include a layer high-k gate 140 material deposited on and physically contacting and interfacing with 2D material 110 or 111 layers on top of which a layer of gate metal 145 can be deposited. Gate structure 235 can line up with, interface with or abut a portion of the 2D material 110 or 111 layer on side or on multiple sides of the carrier nanosheet 115. Gate structure 235 can surround the layer of 2D material 110 or 111 layers around the multiple sides of the carrier nanosheet 115. Gate structure 235 can surround, fully or partially, 2D material layers (e.g., 110 or 111) from all sides, including top, bottom, and sides, not coverly only directions leading to and from the S/D structures 215 and 220, so that 2D channels 250 can be formed. Gate structure 235 can form a GAA structure fully surrounding the central portion of the carrier nanosheet 115 that carries the 2D material layers 110 or 111 between S/D structures 215 and 220.

Gate structure 235 can be formed for example using the steps and techniques described or shown in connection with FIG. 9. Gate structure 235 can be formed for example using the steps and techniques described or shown in connection with FIGS. 17-18. Gate structure 235 can be formed using the steps and techniques described or shown in connection with FIG. 32. Gate structure 235 can be formed, for example, using the steps and techniques described or shown in connection with FIGS. 46, 50, and 53.

Step 5435 can include an insulation between S/D structures 215 and 220 of two different transistors. For example, when two transistors, transistor 100A and transistor 100B, are formed in a single structure, one on top of another, S/D structures 215 and 220 of transistor 100A can be insulated from S/D structures 215 and 220 of transistor 100B. This can be implemented by depositing a layer of dielectric between the two sets of S/D structures 215 and 220.

For example, a first set of S/D structures 215 and 220 can be formed with S/D metal 135 that can fill a trench etched for the S/D regions. The S/D metal 135 deposition can fill the trench which can be formed between the distal ends of the material stack and the surrounding dielectric isolation 130. S/D metal 135 can make electrical contact with 2D materials 110 or 111, or both (e.g., 2D channels 250) of the bottom transistor.

Then, the top portion of the S/D metal 135 deposited into the trench can be taken out via directional partial etching. An insulation layer can be applied using techniques and steps, such as those discussed and shown for example in connection with FIGS. 39-42. The insulation layer can be applied for example between a bottom portion of the S/D metal 135 (e.g., S/D structure 215 or 220) and its top portion. This can be accomplished by removing a top portion of the S/D metal 135 with etching to a height of just about the mid-point of the second sacrificial layer (e.g., second layer of dielectric 105 or sublimation nanosheet 150). The insulation, such as a dielectric 155, can then be applied into the cavity left by the partially etched out S/D metal 135 so that the insulation covers the S/D metal 135 that forms the bottom set of S/D structures 215 and 220. Applying the dielectric on top of the S/D structures 215 and 220 of the bottom transistor can enable independent operation of the bottom and top transistors (e.g., 100A and 100B).

Step 5440 completing the structure for the top transistor. On top of the insulation layer inserted into the S/D metal 135, another layer of S/D metal can be applied to make contact with the 2D materials 110 or 111 remaining on the upper half of the structure. The new S/D metal 135 deposition can include metal filling of the remainder of the etched channel to make the S/D metal 135 flush with the top surface of the structure and stack. CMP can be applied to even out the top surface. This CMP process can be accomplished using steps discussed and shown in connection with FIG. 42.

By completing these steps, S/D structures 215 and 220 of the lower transistor 100 can be electrically insulated from the S/D structures 215 and 220 of the upper transistor 100, thus completing two transistors 100 in the same stack. Steps 5435 and 5440 can be repeated for any number of additional transistor that can be added to the material stack, such that the material stack can support any number N of transistors that utilize 2D material channels 250 made using 2D materials 110 and 111.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features described only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A transistor, comprising:
a first carrier nanosheet;
a first two-dimensional (2D) material surrounding the first carrier nanosheet, and comprising a first portion and a second portion extending along sidewall portions of the first carrier nanosheet, respectively;
a second carrier nanosheet;
a second 2D material surrounding the second carrier nanosheet, and comprising a first portion and a second portion extending along sidewall portions of the second carrier nanosheet, respectively;
a first source/drain structure in electrical contact with the first and second 2D materials through the first portion of the first 2D material and the first portion of the second 2D material, respectively;
a second source/drain structure in electrical contact with the first and second 2D materials through the second portion of the first 2D material and the second portion of the second 2D material, respectively; and
a gate structure at least partially surrounding the first 2D material and the second 2D material,
wherein the first carrier nanosheet laterally extends from the first source/drain structure to the second source/drain structure, with only the first portion of the first 2D material interposed between the first source/drain structure and the first carrier nanosheet and with only the second portion of the first 2D material interposed between the second source/drain structure and the first carrier nanosheet, and wherein the second carrier nanosheet laterally extends from the first source/drain structure to the second source/drain structure, with only the first portion of the second 2D material interposed between the first source/drain structure and the second carrier nanosheet and with only the second portion of the second 2D material interposed between the second source/drain structure and the second carrier nanosheet.

2. The transistor of claim 1, further comprising a high-k gate material formed between the gate structure and the first 2D material and between the gate structure and the second 2D material.

3. The transistor of claim 1, further comprising a first dielectric material electrically insulating the gate structure from the first source/drain structure and a second dielectric material electrically insulating the gate structure from the second source/drain structure.

4. The transistor of claim 1, wherein the first 2D material is disposed between a top surface of the first carrier nanosheet and a first high-k gate material and between a bottom surface of the first carrier nanosheet and the first high-k gate material.

5. The transistor of claim 4, wherein the second 2D material is disposed between a top surface of the second carrier nanosheet and a second high-k gate material and between a bottom surface of the second carrier nanosheet and the second high-k gate material.

6. The transistor of claim 5, wherein the gate structure is disposed between the first high-k gate material and the second high-k gate material.

7. The transistor of claim 1, wherein the gate structure at least partially surrounding the first 2D material is common with the gate structure at least partially surrounding the second 2D material.

8. The transistor of claim 1, wherein the first 2D material is different from the second 2D material.

9. The transistor of claim 1, wherein the first and second carrier nanosheets are parallel with one another, the second carrier nanosheet above the first carrier nanosheet and parallel with a substrate.

10. A method comprising:
forming a first carrier nanosheet;
forming a first two-dimensional (2D) material surrounding the first carrier nanosheet, the first 2D material comprising a first portion and a second portion extending along sidewall portions of the first carrier nanosheet, respectively;
forming a second carrier nanosheet;
forming a second 2D material surrounding the second carrier nanosheet, the second 2D material comprising a first portion and a second portion extending along sidewall portions of the second carrier nanosheet, respectively;
forming a first source/drain structure in electrical contact with the first and second 2D materials through the first portion of the first 2D material and the first portion of the second 2D material, respectively;
forming a second source/drain structure in electrical contact with the first and second 2D materials through the second portion of the first 2D material and the second portion of the second 2D material, respectively; and
forming a gate structure at least partially surrounding the first 2D material and the second 2D material,
wherein the first carrier nanosheet laterally extends from the first source/drain structure to the second source/drain structure, with only the first portion of the first 2D material interposed between the first source/drain structure and the first carrier nanosheet and with only the second portion of the first 2D material interposed between the second source/drain structure and the first carrier nanosheet, and wherein the second carrier nanosheet laterally extends from the first source/drain structure to the second source/drain structure, with only the first portion of the second 2D material interposed between the first source/drain structure and the second carrier nanosheet and with only the second portion of the second 2D material interposed between the second source/drain structure and the second carrier nanosheet.

11. The method of claim 10, further comprising forming a high-k gate material between the gate structure and the first 2D material and between the gate structure and the second 2D material.

12. The method of claim 10, further comprising forming a first dielectric material electrically insulating the gate structure from the first source/drain structure and a second dielectric material electrically insulating the gate structure from the second source/drain structure.

13. The method of claim 10, further comprising forming the first 2D material disposed between a top surface of the first carrier nanosheet and a first high-k gate material and between a bottom surface of the first carrier nanosheet and the first high-k gate material.

14. The method of claim 13, further comprising forming the second 2D material disposed between a top surface of the second carrier nanosheet and a second high-k gate material and between a bottom surface of the second carrier nanosheet and the second high-k gate material.

15. The method of claim 14, further comprising forming the gate structure disposed between the first high-k gate material and the second high-k gate material.

16. The method of claim 10, further comprising forming the gate structure at least partially surrounding the first 2D material common with the gate structure at least partially surrounding the second 2D material.

17. The method of claim 10, further comprising forming the first 2D material different from the second 2D material.

18. The method of claim 10, further comprising the first and second carrier nanosheets parallel with one another, the second carrier nanosheet above the first carrier nanosheet and parallel with a substrate.

19. A device comprising:
a source contact having a sidewall surface;
a drain contact having a sidewall surface;
a carrier nanosheet;
a two-dimensional (2D) material comprising a plurality of portions, a first one of the plurality of portions extending along a first sidewall of the carrier nanosheet and interposed between the sidewall surface of the source contact and the first sidewall of the carrier nanosheet, and a second one of the plurality of portions extending along a second sidewall of the carrier nanosheet and interposed between the sidewall surface of the drain contact and the second sidewall of the carrier nanosheet; and
a gate structure isolated from the source and drain contacts and provided on at least one side of the 2D material, the gate structure comprising a gate contact and a gate dielectric between the gate contact and the 2D material,
wherein the carrier nanosheet laterally extends from the source contact to the drain contact, with only the first portion of the 2D material interposed between the source contact and the carrier nanosheet and with only the second portion of the 2D material interposed between the drain contact and the carrier nanosheet.

20. The device of claim 19, wherein the 2D material is supported by the carrier nanosheet, and at least a third one of the plurality of portions of the 2D material is disposed between a top or bottom surface of the carrier nanosheet and the gate dielectric.

* * * * *